(12) United States Patent
Nagashima et al.

(10) Patent No.: US 11,049,868 B2
(45) Date of Patent: Jun. 29, 2021

(54) STACKED TYPE SEMICONDUCTOR MEMORY DEVICE

(71) Applicant: Toshiba Memory Corporation, Minato-ku (JP)

(72) Inventors: Satoshi Nagashima, Yokkaichi (JP); Tatsuya Kato, Yokkaichi (JP); Wataru Sakamoto, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/706,559

(22) Filed: Sep. 15, 2017

(65) Prior Publication Data

US 2018/0006051 A1    Jan. 4, 2018

Related U.S. Application Data

(63) Continuation of application No. PCT/JP2015/063066, filed on May 1, 2015.

(51) Int. Cl.
*H01L 27/115* (2017.01)
*H01L 27/11556* (2017.01)
(Continued)

(52) U.S. Cl.
CPC .... *H01L 27/11556* (2013.01); *G11C 16/0483* (2013.01); *G11C 16/10* (2013.01); *H01L 21/76885* (2013.01); *H01L 23/528* (2013.01); *H01L 27/11521* (2013.01); *H01L 29/7889* (2013.01)

(58) Field of Classification Search
CPC ............... H01L 27/11524; H01L 27/11529
See application file for complete search history.

(56) References Cited

U.S. PATENT DOCUMENTS 7,859,902 B2    12/2010  Maejima
8,431,969 B2     4/2013  Kim et al.
(Continued)

FOREIGN PATENT DOCUMENTS

JP    2009-266946 A    11/2009
JP    2010-130016 A     6/2010
(Continued)

OTHER PUBLICATIONS

International Search Report dated Jun. 9, 2015 for PCT/JP2015/063066 filed May 1, 2015 with English Translation of Categories.
(Continued)

*Primary Examiner* — Suberr L Chi
(74) *Attorney, Agent, or Firm* — Oblon, McClelland, Maier & Neustadt, L.L.P.

(57) ABSTRACT

A semiconductor memory device according to an embodiment, includes a plurality of semiconductor pillars extending in a first direction and being arranged along a second direction crossing the first direction, two interconnects extending in the second direction and being provided on two sides of the plurality of semiconductor pillars in a third direction crossing the first direction and the second direction, and an electrode film disposed between each of the semiconductor pillars and each of the interconnects. The two interconnects are drivable independently from each other.

16 Claims, 24 Drawing Sheets

(51) Int. Cl.
  *G11C 16/04* (2006.01)
  *G11C 16/10* (2006.01)
  *H01L 29/788* (2006.01)
  *H01L 21/768* (2006.01)
  *H01L 23/528* (2006.01)
  *H01L 27/11521* (2017.01)

(56) References Cited

U.S. PATENT DOCUMENTS

| | | |
|---|---|---|
| 2010/0128509 A1 | 5/2010 | Kim et al. |
| 2010/0202206 A1 | 8/2010 | Seol et al. |
| 2011/0199804 A1 | 8/2011 | Son et al. |
| 2012/0213009 A1* | 8/2012 | Aritome ............. G11C 16/0408 365/185.29 |
| 2013/0221423 A1 | 8/2013 | Kawasaki et al. |
| 2013/0341701 A1 | 12/2013 | Blomme et al. |
| 2014/0035019 A1* | 2/2014 | Lee ...................... H01L 29/788 257/315 |
| 2014/0085979 A1 | 3/2014 | Kono |
| 2015/0200199 A1 | 7/2015 | Sakamoto et al. |
| 2016/0093382 A1 | 3/2016 | Sakamoto et al. |
| 2016/0190147 A1 | 6/2016 | Kato et al. |
| 2017/0352735 A1 | 12/2017 | Kato et al. |
| 2017/0373082 A1 | 12/2017 | Sekine et al. |

FOREIGN PATENT DOCUMENTS

| | | |
|---|---|---|
| JP | 2010-187000 A | 8/2010 |
| JP | 2013-182949 A | 9/2013 |
| JP | 2013-543266 A | 11/2013 |
| JP | 2014-067942 A | 4/2014 |
| WO | WO 2016/135849 A1 | 1/2016 |
| WO | WO 2016/139727 A1 | 9/2016 |

OTHER PUBLICATIONS

International Written Opinion dated Jun. 9, 2015 for PCT/JP2015/063066 filed May 1, 2015.

* cited by examiner

STACKED TYPE SEMICONDUCTOR MEMORY DEVICE

CROSS-REFERENCE TO RELATED APPLICATION

This is a continuation application of International Application PCT/JP2015/063066, filed on May 1, 2015; the entire contents of which are incorporated herein by reference.

FIELD

An embodiment relates to a semiconductor memory device.

BACKGROUND

Conventionally, in NAND flash memory, the bit cost has been reduced by increasing the integration by downscaling the planar structure. However, with downscaling, the program/erase window is reduced; and the number of electrons that can be stored in each memory cell decreases; therefore, the downscaling of the planar structure is approaching a limit. Therefore, in recent years, technology has been proposed to stack the memory cells in the vertical direction. However, the reliability of the operation is a challenge for such a stacked type memory device.

DETAILED DESCRIPTION

A semiconductor memory device according to an embodiment, includes a plurality of semiconductor pillars extending in a first direction and being arranged along a second direction crossing the first direction, two interconnects extending in the second direction and being provided on two sides of the plurality of semiconductor pillars in a third direction crossing the first direction and the second direction, and an electrode film disposed between each of the semiconductor pillars and each of the interconnects. The two interconnects are drivable independently from each other.

First Embodiment

First, a first embodiment will be described.

Figure 1:
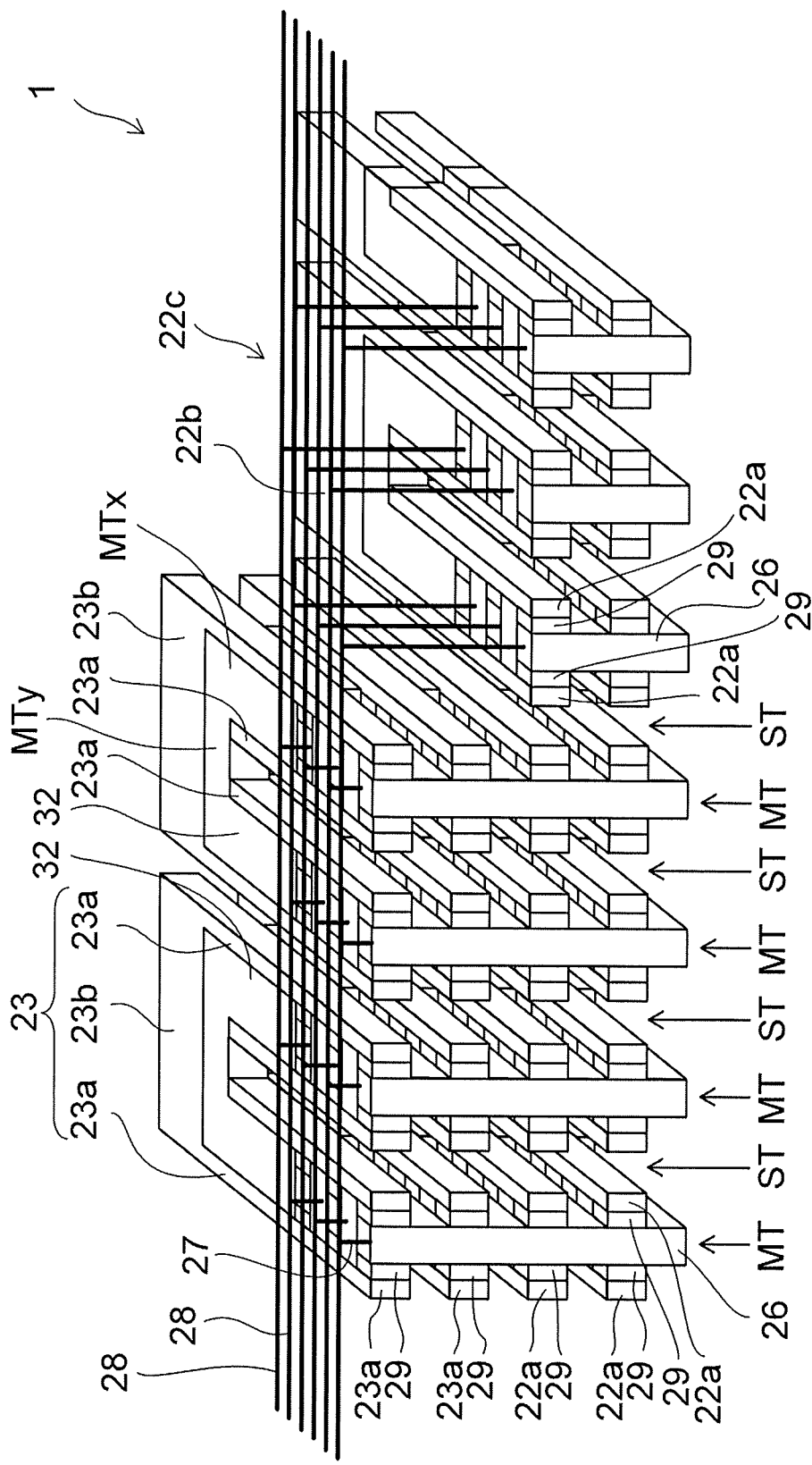
FIG. 1 is a perspective view showing a semiconductor memory device according to a first embodiment.

FIG. 1 is a perspective view showing a semiconductor memory device according to the embodiment.

Figure 2:
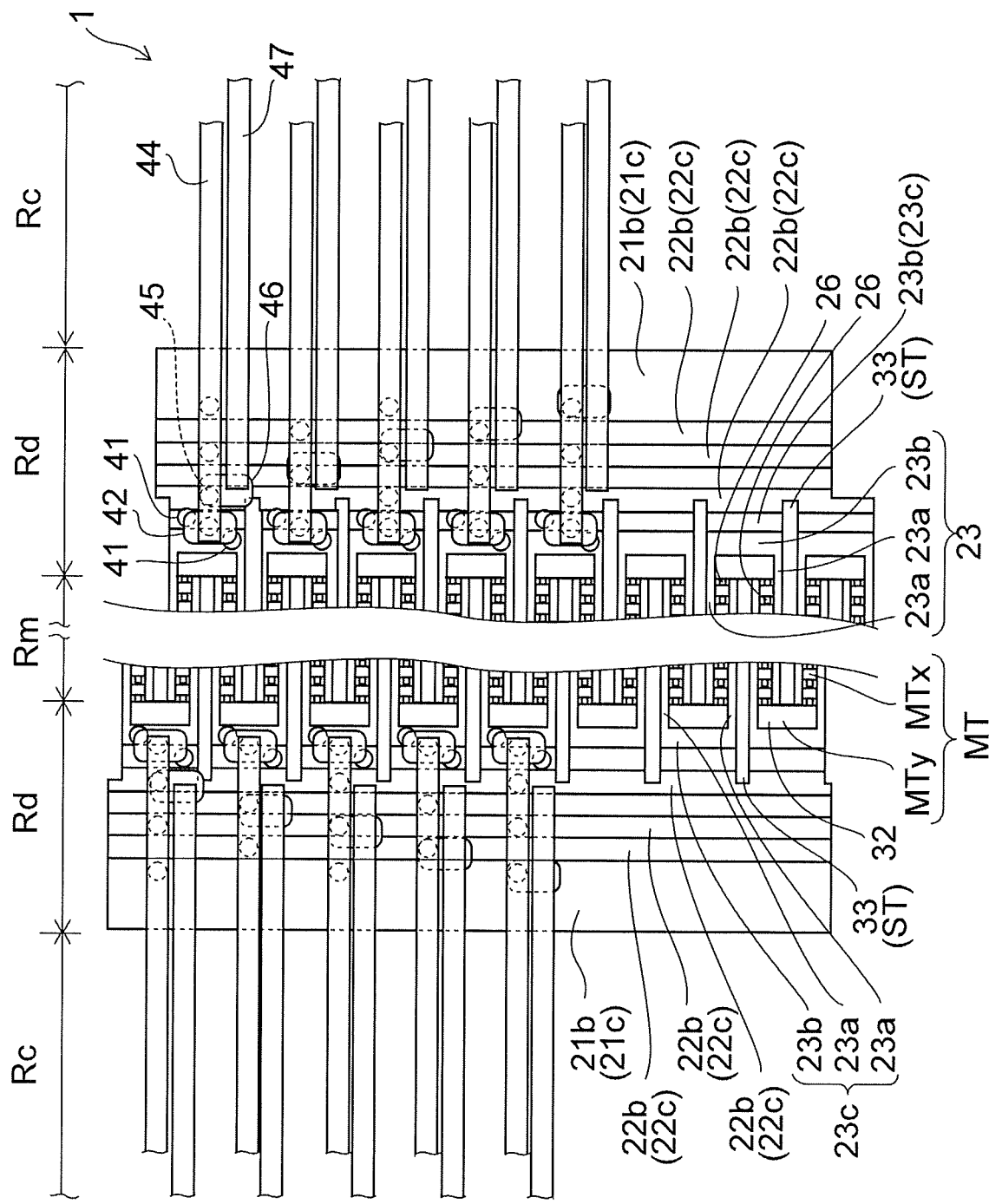
FIG. 2 is a plan view showing the semiconductor memory device according to the first embodiment.

FIG. 2 is a plan view showing the semiconductor memory device according to the embodiment.

Figure 3:
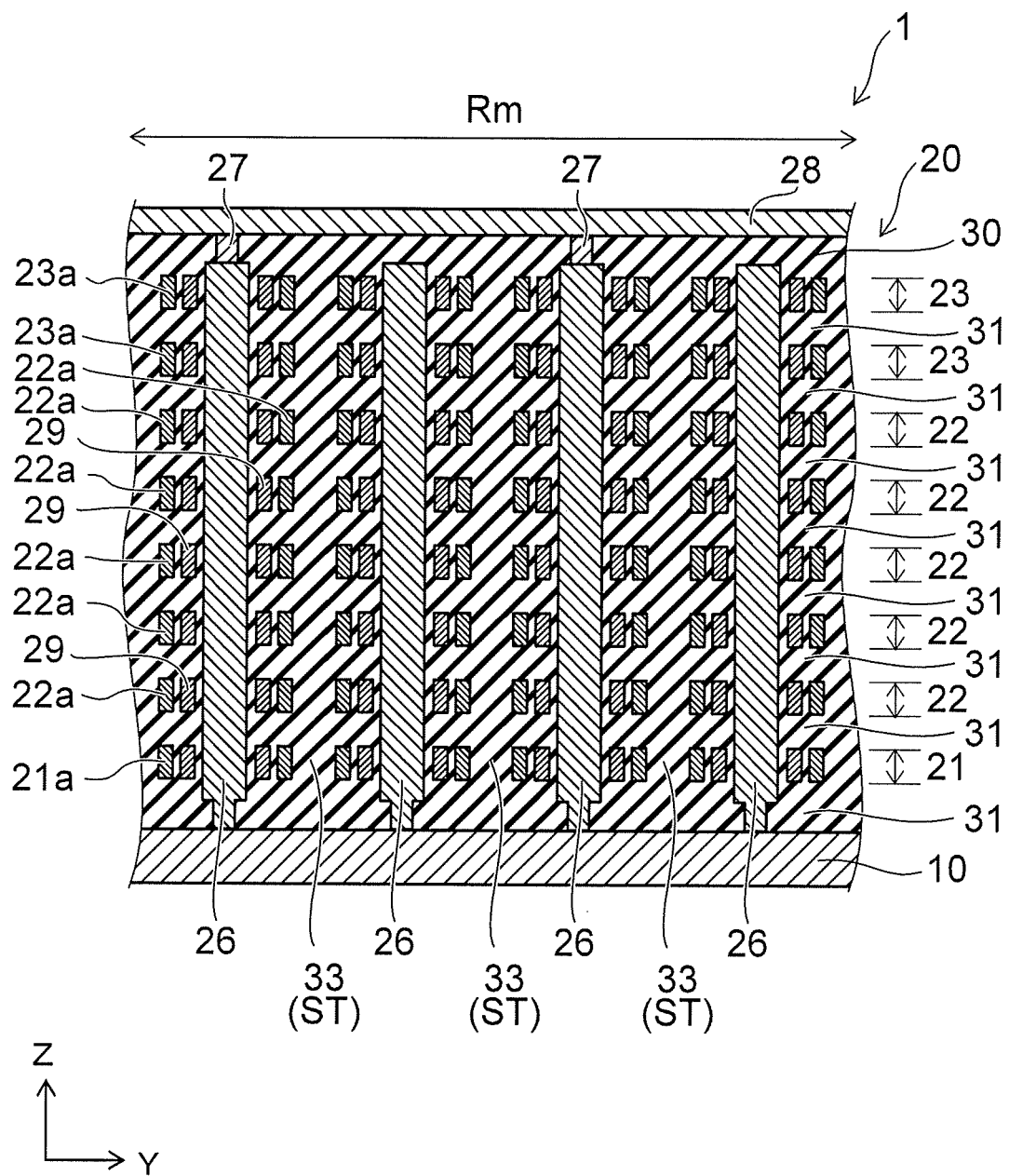
FIG. 3 is a cross-sectional view showing the semiconductor memory device according to the first embodiment.

FIG. 3 is a cross-sectional view showing the semiconductor memory device according to the embodiment.

Figure 4:
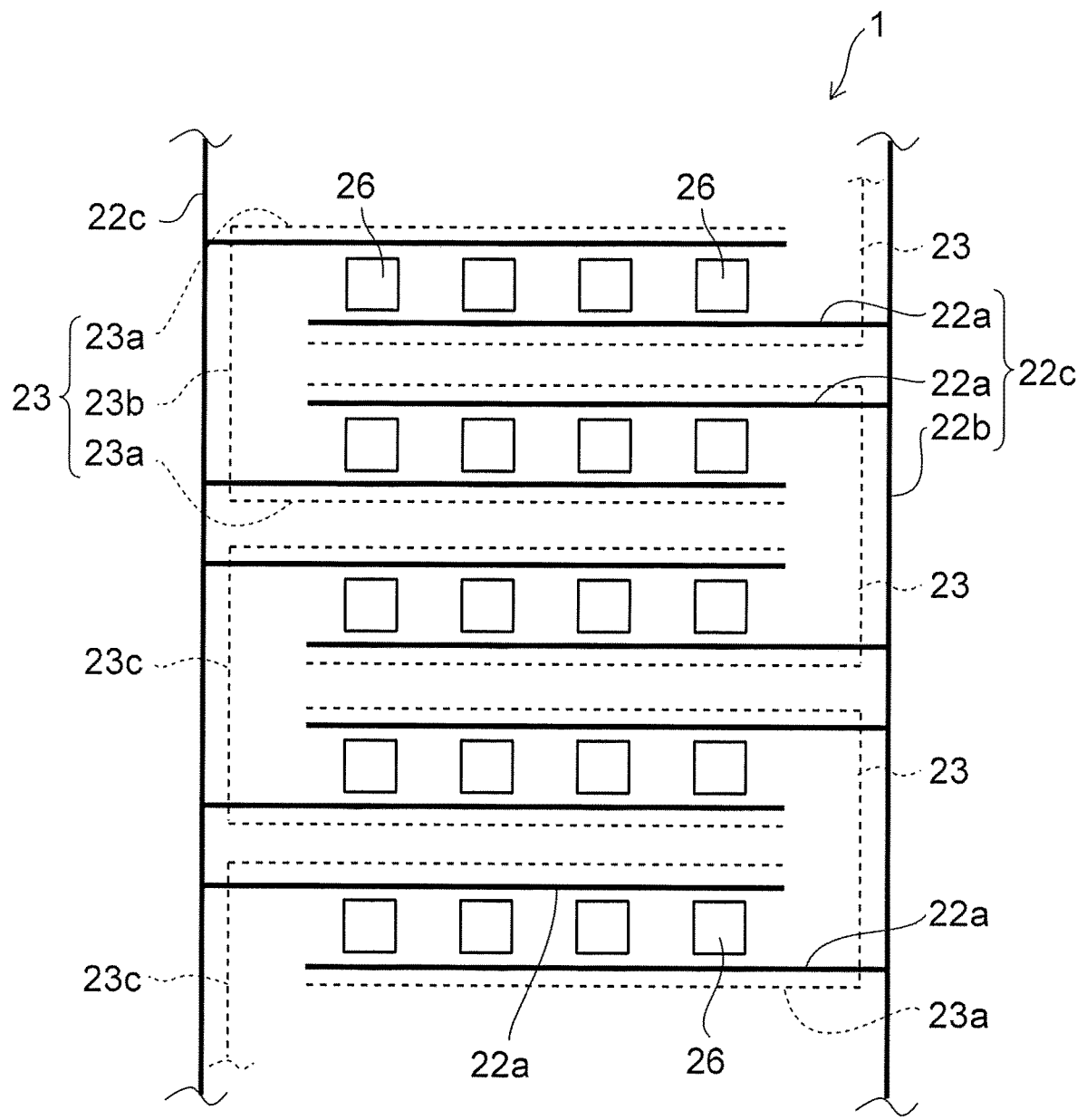
FIG. 4 is a schematic circuit diagram showing the semiconductor memory device according to the first embodiment.

FIG. 4 is a schematic circuit diagram showing the semiconductor memory device according to the embodiment.

Figure 5A:
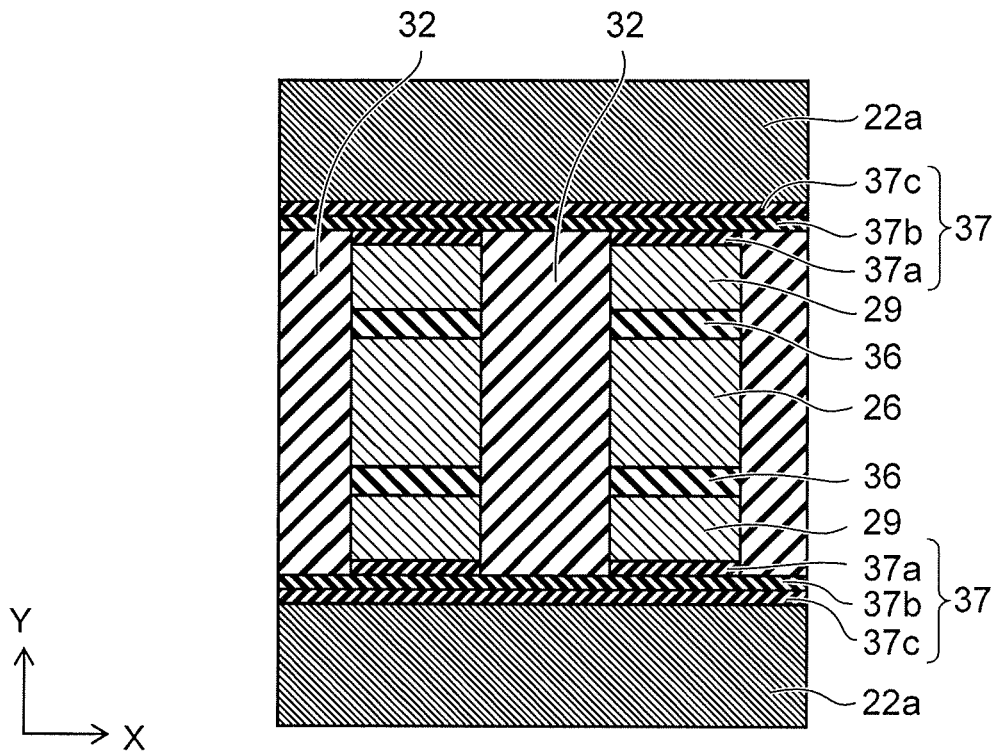
FIG. 5A and FIG. 5B are partially enlarged cross-sectional views showing the semiconductor memory device according to the first embodiment.
Figure 5B:
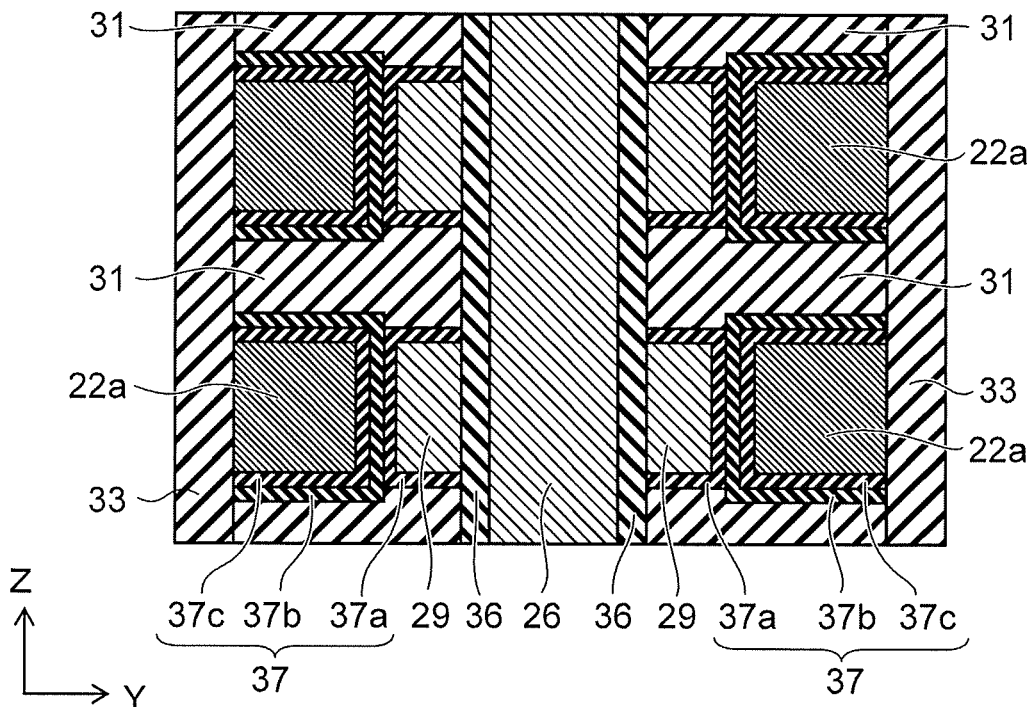

FIG. 5A and FIG. 5B are partially enlarged cross-sectional views showing the semiconductor memory device according to the embodiment.

Because FIG. 1 to FIG. 4 are drawings showing the general concept of the device, only some of the members are schematically drawn; and the other members are not illustrated. In FIG. 4, conductive members 23c of upper selection gate interconnect layers 23 described below are shown by broken lines; and comb-shaped members 22c of word line interconnect layers 22 are shown by solid lines.

First, a schematic configuration of the semiconductor memory device according to the embodiment will be described.

As shown in FIG. 1 to FIG. 4, a silicon substrate 10 is provided in the semiconductor memory device 1 according to the embodiment. Hereinbelow, an XYZ orthogonal coordinate system is employed in the specification for convenience of description. Two mutually-orthogonal directions parallel to the upper surface of the silicon substrate 10 are taken as an "X-direction" and a "Y-direction;" and a direction perpendicular to the upper surface is taken as a "Z-direction."

A memory region Rm, an interconnect draw-out region Rd, and a peripheral circuit region Rc are set in the semiconductor memory device 1. Many memory cells are arranged three-dimensionally in the memory region Rm. The interconnect draw-out regions Rd are disposed on the two X-direction sides of the memory region Rm. The peripheral circuit regions Rc are disposed at the peripheries of the memory region Rm and the interconnect draw-out regions Rd. The peripheral circuit is formed in the peripheral circuit region Rc; and the memory cells are operated by inputting and outputting signals to and from the memory cells. The interconnect draw-out region Rd is a region for drawing out the interconnects extending in the X-direction from the memory region Rm and for connecting the interconnects to the peripheral circuit.

For example, a stacked body 20 is configured by stacking, to be separated from each other with inter-layer insulating films 31 interposed, one layer of a lower selection gate interconnect layer 21, multiple layers of the word line interconnect layers 22, and one or more layers, e.g., two layers, of the upper selection gate interconnect layers 23 on the silicon substrate 10. All of the layers of the stacked body 20 are disposed in the memory region Rm. In the interconnect draw-out region Rd, the configuration of the stacked body 20 is a staircase configuration that is drawn out more to the outer side toward the lower levels. In other words, the word line interconnect layers 22 and the upper selection gate interconnect layers 23 are not disposed in the regions directly above the two X-direction end portions of the lower selection gate interconnect layer 21; the word line interconnect layers 22 and the upper selection gate interconnect layers 23 of the levels above one word line interconnect layer 22 are not disposed in the regions directly above the two X-direction end portions of the one word line interconnect layer 22; and the upper selection gate interconnect layers 23 are not disposed in the regions directly above the two X-direction end portions of the word line interconnect layer 22 of the uppermost level.

A memory trench MT that has a snake-like configuration extending in the Y-direction as an entirety while extending back and forth in the X-direction is formed in the stacked body 20. Namely, MTx that extends in the X-direction and MTy that extends in the Y-direction are linked alternately in the memory trench MT. The memory trench MT pierces the stacked body 20 in the Z-direction and reaches the silicon substrate 10. Multiple silicon pillars 26 are arranged in one column along the X-direction inside the portion MTx extending in the X-direction in the memory trench MT. The configuration of each of the silicon pillars 26 is a quadrilateral column extending in the Z-direction. The lower end of the silicon pillar 26 is connected to the silicon substrate 10. The silicon pillars 26 are arranged in a matrix configuration along the X-direction and the Y-direction in the entire memory region Rm. An insulating member 32 that is made of, for example, silicon oxide is provided between the silicon pillars 26 inside the memory trench MT. The silicon pillars 26 are not disposed inside the portion MTy extending in the Y-direction in the memory trench MT; and the portion MTy is filled with the insulating member 32.

Further, a slit ST that has a rectangular configuration extending in the X-direction also is formed in the stacked body 20. The slit ST pierces the stacked body 20 in the Z-direction and reaches the silicon substrate 10. An insulating member 33 that is made of, for example, silicon oxide is filled into the slit ST. One end portion of the slit ST communicates with the portion MTy of the memory trench MT. Also, the greater part of the slit ST including the one end portion is surrounded in three directions by the memory trench MT having the snake-like configuration, but is separated from the portion MTx. Thereby, the portion of the upper selection gate interconnect layer 23 interposed between the memory trench MT and the slit ST is an upper selection gate line 23a extending in the X-direction. Similarly also for the word line interconnect layer 22 and the lower selection gate interconnect layer 21, the portions of the word line interconnect layer 22 and the lower selection gate interconnect layer 21 interposed between the memory trench MT and the slit ST respectively are a word line 22a and a lower selection gate line 21a. Therefore, the lower selection gate line 21a, the word line 22a, and the upper selection gate line 23a are disposed on the two Y-direction sides of the silicon pillar 26.

The other end portion of the slit ST extends in the X-direction from the memory trench MT having the snake-like configuration and is terminated where the slit ST divides the upper selection gate interconnect layer 23. Thereby, the upper selection gate interconnect layer 23 is divided by the memory trench MT and the slit ST into the conductive members 23c having the C-shaped configurations when viewed from the Z-direction. The two upper selection gate lines 23a that extend in the X-direction and a link member 23b that connects the end portions of the two upper selection gate lines 23a to each other are provided as one body in each of the conductive members 23c. The conductive members 23c that have the C-shaped configurations are disposed in a meshing configuration from two sides in the X-direction. In other words, one of the upper selection gate lines 23a of each of another two conductive members 23c disposed on the opposite side in the X-direction of one conductive member 23c are disposed between the two upper selection gate lines 23a of the one conductive member 23c.

On the other hand, although the slit ST divides the word line interconnect layers 22 and the lower selection gate interconnect layer 21 at the boundary of the block, the slit ST does not divide the word line interconnect layers 22 and the lower selection gate interconnect layer 21 inside the block. Therefore, inside each block, the word line interconnect layer 22 is divided into two comb-shaped members 22c by the memory trench MT and the slit ST. In each of the comb-shaped members 22c, one link member 22b that extends in the Y-direction is provided; and the multiple word lines 22a that extend in the X-direction extend from the link member 22b. The two comb-shaped members 22c are disposed in a meshing configuration opposing each other from the two sides in the X-direction; and the two word lines 22a of one comb-shaped member 22c and the two word lines 22a of another comb-shaped member 22c are arranged alternately along the Y-direction. The slit ST is disposed between the two word lines 22a of one comb-shaped member 22c; and the memory trench MT is disposed between the two word lines 22a belonging to the two comb-shaped members 22c. This is similar also for the lower selection gate interconnect layer 21. In other words, the lower selection gate interconnect layer 21 is divided into two comb-shaped members 21c; and in each of the comb-shaped members 21c, one link member 21b that extends in the Y-direction and many lower selection gate lines 21a that extend in the X-direction are provided.

The memory region Rm will now be described.

Bit line plugs 27 are provided on the silicon pillars 26; and multiple bit lines 28 that extend in the Y-direction are provided on the bit line plugs 27. Two bit lines 28 are disposed on the silicon pillars 26 arranged in one column along the Y-direction; and the bit lines 28 are connected to every other silicon pillar 26 via the bit line plugs 27. Thereby, the two silicon pillars 26 that are adjacent to each other in the Y-direction are connected to mutually-different bit lines 28. For example, the bit lines 28 are connected to sense amplifiers of the peripheral circuit. An inter-layer insulating film 30 that is made of, for example, silicon oxide is provided on the stacked body 20; and the bit line plugs 27 and the bit lines 28 are buried inside the inter-layer insulating film 30. In FIG. 1, the bit line plugs 27 and the bit lines 28 are illustrated by straight lines for convenience of illustration. Also, the bit line plugs 27 and the bit lines 28 are not illustrated in FIG. 2.

A floating gate electrode film 29 is provided between each of the silicon pillars 26 and each of the word lines 22a. The floating gate electrode film 29 is a conductive member that stores charge and is formed of, for example, polysilicon (Si).

As shown in FIG. 5A and FIG. 5B, a tunneling insulating film 36 is provided between the silicon pillar 26 and the floating gate electrode film 29. The tunneling insulating film 36 is a film in which a tunneling current flows when a prescribed voltage within the range of the drive voltage of the semiconductor memory device 1 is applied and is, for example, a single-layer silicon oxide film, or a three-layer film made of a silicon oxide layer, a silicon nitride layer, and a silicon oxide layer.

Also, a high dielectric constant layer 37a that is made of a high dielectric constant material such as silicon nitride (SiN), hafnium oxide ($HfO_2$), aluminum oxide ($Al_2O_3$), etc., is provided on the side surface of the floating gate electrode film 29 on the word line 22a side, on the upper surface of the floating gate electrode film 29, and on the lower surface of the floating gate electrode film 29. The high dielectric constant layer 37a may contain a metal such as ruthenium (Ru), titanium (Ti), etc. The configuration of the high dielectric constant layer 37a in the YZ cross section is a C-shaped configuration surrounding the floating gate electrode film 29.

On the other hand, a high dielectric constant layer 37c that is made of a high dielectric constant material is formed on the side surface of the word line 22a on the floating gate electrode film 29 side, on the upper surface of the word line 22a, and on the lower surface of the word line 22a; and a silicon oxide layer 37b that is made of silicon oxide ($SiO_2$) is formed on the high dielectric constant layer 37c. The configurations of the silicon oxide layer 37b and the high dielectric constant layer 37c in the YZ cross section are C-shaped configurations surrounding the word line 22a.

Thereby, the high dielectric constant layer 37a, the silicon oxide layer 37b, and the high dielectric constant layer 37c are stacked in this order between the floating gate electrode film 29 and the word line 22a. A blocking insulating film 37 includes the high dielectric constant layer 37a, the silicon oxide layer 37b, and the high dielectric constant layer 37c. The blocking insulating film 37 is a film in which a current substantially does not flow even when a voltage within the range of the drive voltage of the semiconductor memory device 1 is applied.

In the semiconductor memory device 1, a transistor that includes one floating gate electrode film 29 is formed at each crossing portion between the silicon pillars 26 and the word lines 22a; and the transistor functions as a memory cell. Also, a NAND string in which the multiple memory cells are connected in series is connected between the bit line 28 and the silicon substrate 10.

The interconnect draw-out region Rd will now be described.

As shown in FIG. 2, a contact 41 is provided on the link member 23b of each of the conductive members 23c of the upper selection gate interconnect layers 23; and an intermediate interconnect 42 is provided on the contact 41. When viewed from the Z-direction, the intermediate interconnect 42 is disposed in the interior of the link member 23b every link member 23b. A via 43 is provided on the intermediate interconnect 42; and an upper layer interconnect 44 that extends in the X-direction is provided on the via 43. Thereby, each of the conductive members 23c is connected to the upper layer interconnect 44 via the contact 41, the intermediate interconnect 42, and the via 43.

A contact 45 is provided on the link member 22b of each of the comb-shaped members 22c of each of the word line interconnect layers 22; an intermediate interconnect 46 is provided on some of the contacts 45; and an upper layer interconnect 47 that extends in the X-direction is provided on the intermediate interconnect 46. Thereby, each of the comb-shaped members 22c is connected to the upper layer interconnect 47 via the contact 45 and the intermediate interconnect 46. Similarly for the lower selection gate interconnect layer 21 as well, each of the comb-shaped members 21c is connected to an upper layer interconnect (not illustrated) via a contact (not illustrated) and an intermediate interconnect (not illustrated).

As described above, because the configurations of the two X-direction end portions of the stacked body 20 are staircase configurations, the contacts 45 that are connected to the word line interconnect layers 22 are further on the outer side, that is, on the side distal to the memory region Rm, than are the contacts 41 connected to the upper selection gate interconnect layers 23. Among the word line interconnect layers 22, the contacts 45 that are connected to the word line interconnect layers 22 are positioned more on the outer side toward the lower layers. The contact that is connected to the lower selection gate interconnect layer 21 is further on the outer side than are the contacts 45. In other words, among the word line interconnect layers 22 of two layers, the distance between the contact 45 connected to the link member 22b of the word line interconnect layer 22 of the upper layer and the silicon pillar 26 most proximal to that contact 45 is shorter than the distance between the contact 45 connected to the link member 22b of the word line interconnect layer 22 of the lower layer and the silicon pillar 26 most proximal to that contact 45.

For example, the positional relationship between the word lines 22a and the silicon pillars 26 and the connectional relationship between the word lines 22a can be expressed as follows. This is similar for the lower selection gate line 21a as well.

Namely, the multiple silicon pillars 26 are arranged in one column along the X-direction between the (4n+1)th word line 22a and the (4n+2)th word line 22a and between the (4n+3)th word line 22a and the (4n+4)th word line 22a counting along the Y-direction, where n is an integer of 0 or more. The silicon pillars 26 are not disposed between the (4n+2)th word line 22a and the (4n+3)th word line 22a. Also, the floating gate electrode film 29 is disposed between the silicon pillar 26 and the word line 22a. Also, the (4n+1)th word line 22a and the (4n+4)th word line 22a are connected to each other by the first link member 22b extending in the Y-direction; and the (4n+2)th word line 22a and the (4n+3)th word line 22a are connected to each other by the second link member 22b extending in the Y-direction. Therefore, a first comb-shaped member 22c (a first interconnect group) that includes the (4n+1)th word line 22a and the (4n+4)th word line 22a and a second comb-shaped member 22c (a second interconnect group) that includes the (4n+2)th word line 22a and the (4n+3)th word line 22a are drivable independently from each other. Accordingly, the word lines 22a that are disposed on the two Y-direction sides of one silicon pillar 26 are drivable independently from each other.

Also, for example, the connectional relationship between the upper selection gate lines 23a can be expressed as follows.

The (8n+1)th upper selection gate line 23a and the (8n+4)th upper selection gate line 23a counting along the Y-direction are connected to each other by the link member 23b and are included in a first C-shaped conductive member 23c.

The (8n+3)th upper selection gate line 23a and the (8n+6)th upper selection gate line 23a are connected to each other by the link member 23b and are included in a second C-shaped conductive member 23c. The (8n+5)th upper selection gate line 23a and the (8n+8)th upper selection gate line 23a are connected to each other by the link member 23b and are included in a third C-shaped conductive member 23c. The (8n+7)th upper selection gate line 23a and the (8n+10)th upper selection gate line 23a are connected to each other by the link member 23b and are included in a fourth C-shaped conductive member 23c. Also, the first to fourth conductive members 23c are drivable independently from each other.

A method for manufacturing the semiconductor memory device according to the embodiment will now be described.

FIG. 6 to FIG. 11, FIG. 13 to FIG. 15, and FIG. 17 to FIG. 23 are perspective views showing the method for manufacturing the semiconductor memory device according to the embodiment.

Figure 12:
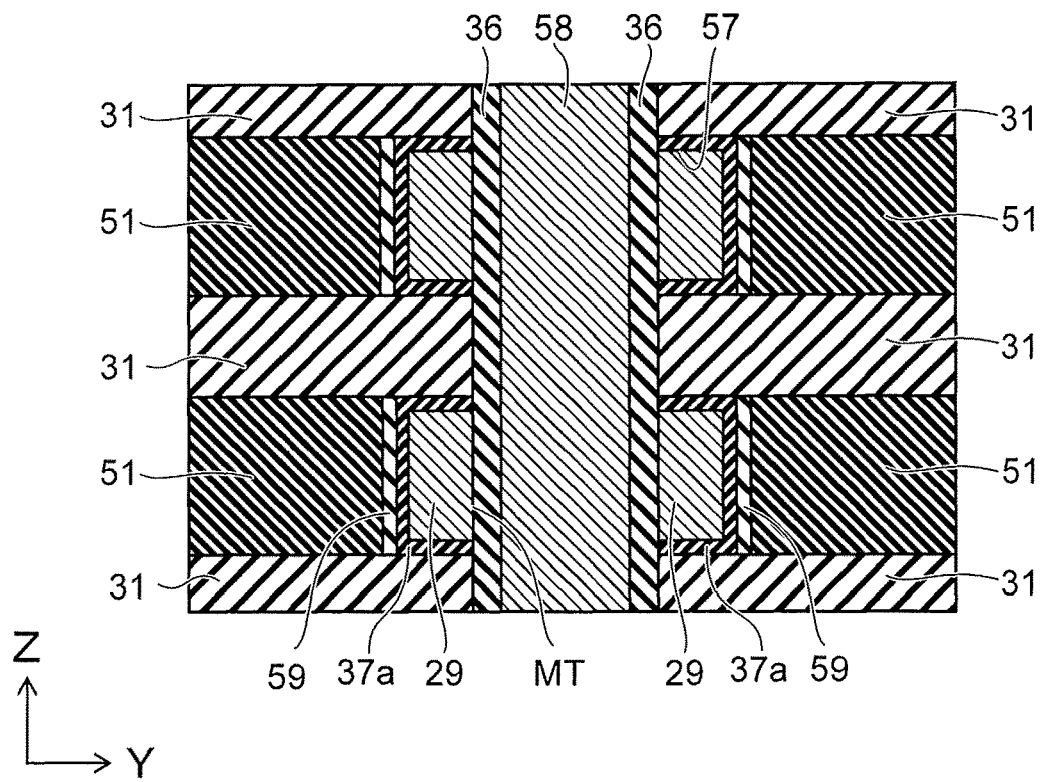
FIG. 12 is a cross-sectional view showing the method for manufacturing the semiconductor memory device according to the first embodiment.

FIG. 12 is a cross-sectional view showing the method for manufacturing the semiconductor memory device according to the embodiment.

Figure 16:
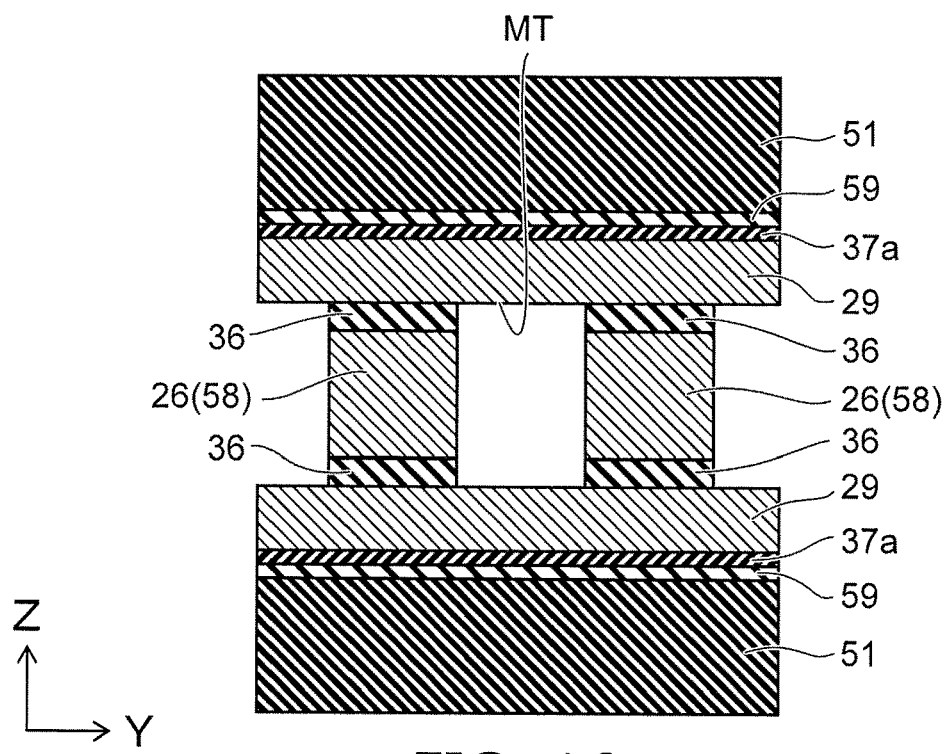
FIG. 16 is a plan view showing the method for manufacturing the semiconductor memory device according to the first embodiment.

FIG. 16 is a plan view showing the method for manufacturing the semiconductor memory device according to the embodiment.

First, the silicon substrate 10 is prepared as shown in FIG. 3.

Figure 6:
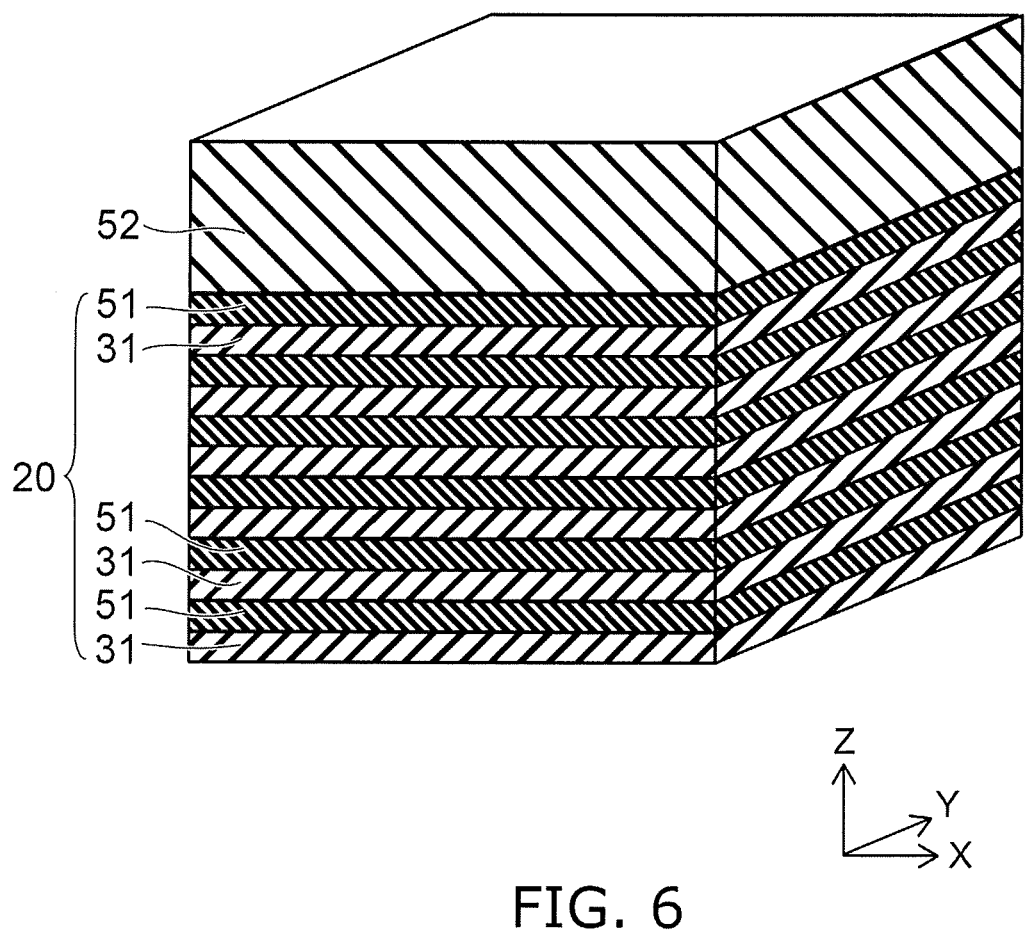
FIG. 6 to FIG. 11 are perspective views showing a method for manufacturing the semiconductor memory device according to the first embodiment.

Then, as shown in FIG. 6, the stacked body 20 is formed by alternately forming the inter-layer insulating films 31 made of silicon oxide and sacrificial films 51 made of silicon nitride using, for example, CVD (chemical vapor deposition). Then, a hard mask film 52 that is made of silicon oxide is formed by CVD using TEOS (Tetra Ethyl Ortho Silicate: $Si(OC_2H_5)_4$) as a source material.

Figure 7:
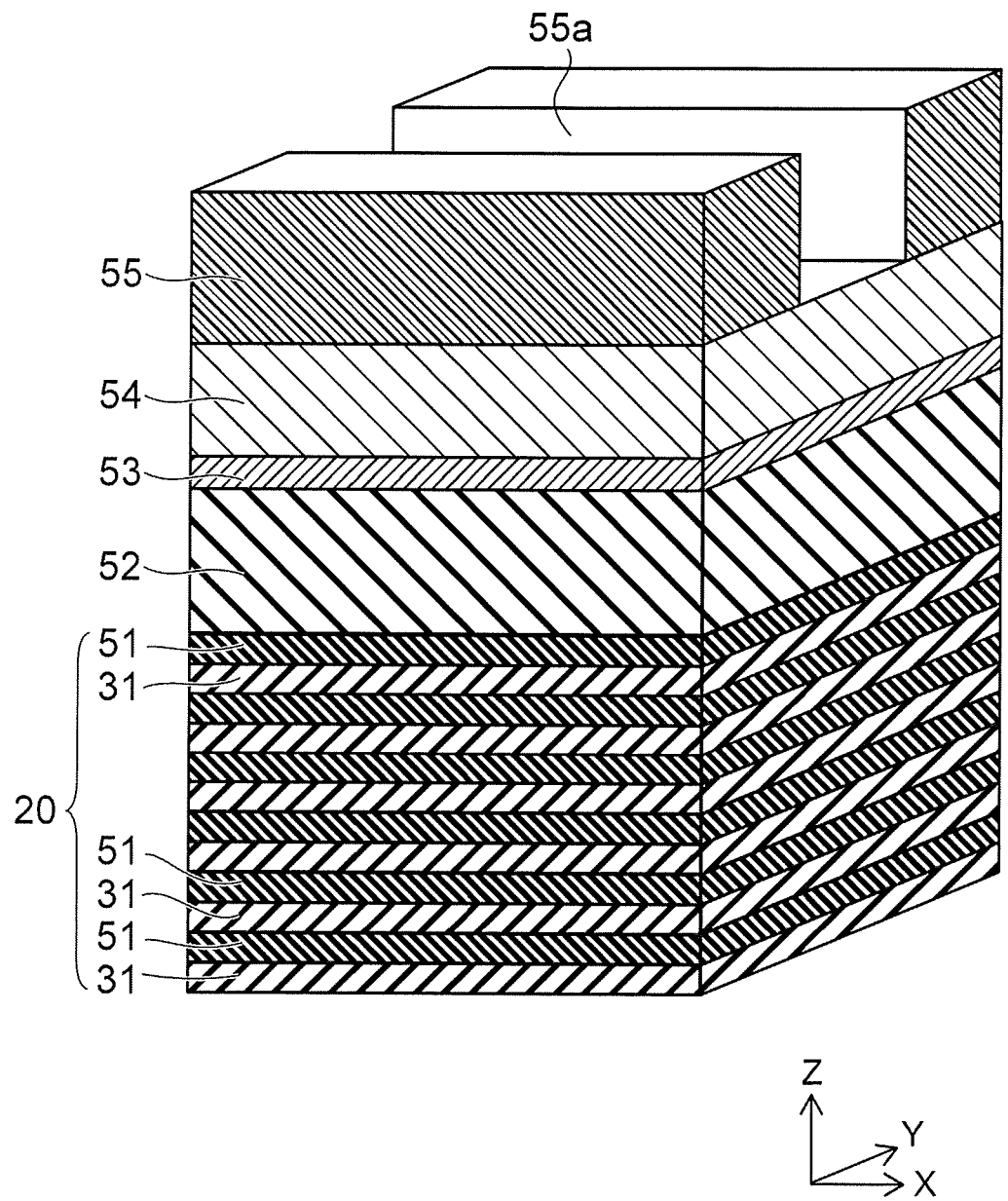

Then, as shown in FIG. 7, a carbon film 53 and an anti-reflection film 54 are formed on the hard mask film 52; and a resist film is coated onto the carbon film 53 and the anti-reflection film 54. Then, a resist pattern 55 is formed by patterning the resist film using lithography. An opening 55a that has a snake-like configuration extending in the Y-direction as an entirety while extending back and forth in the X-direction is formed in the resist pattern 55. A portion of the opening 55a extending in the X-direction is shown in FIG. 7.

Figure 8:
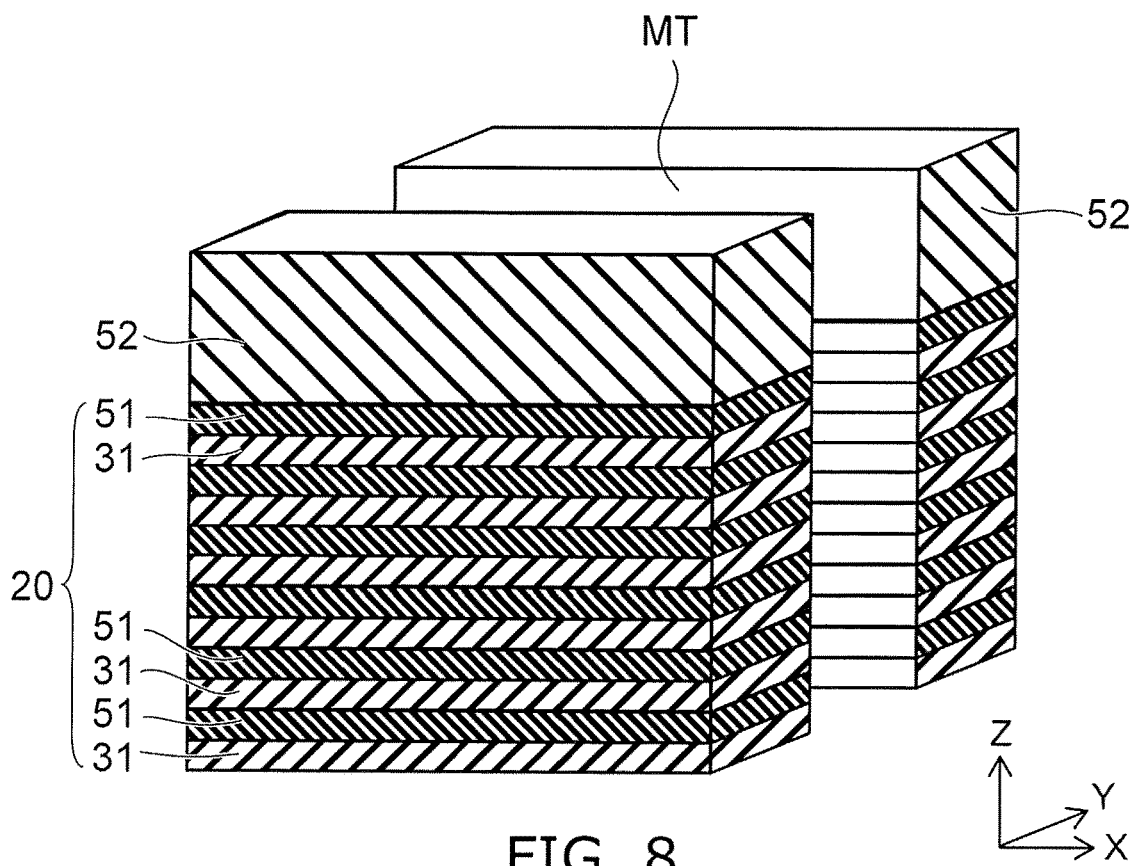

Then, as shown in FIG. 8, the pattern of the resist pattern 55 is transferred to the hard mask film 52 by performing anisotropic etching such as RIE (Reactive Ion Etching), etc. Then, the memory trench MT is formed by removing the portion of the stacked body 20 disposed in the region directly under the opening 55a by performing RIE using the hard mask film 52 as a mask. Then, deposits are removed by performing wet processing. The hard mask film 52 remains in this stage as well.

Figure 9:
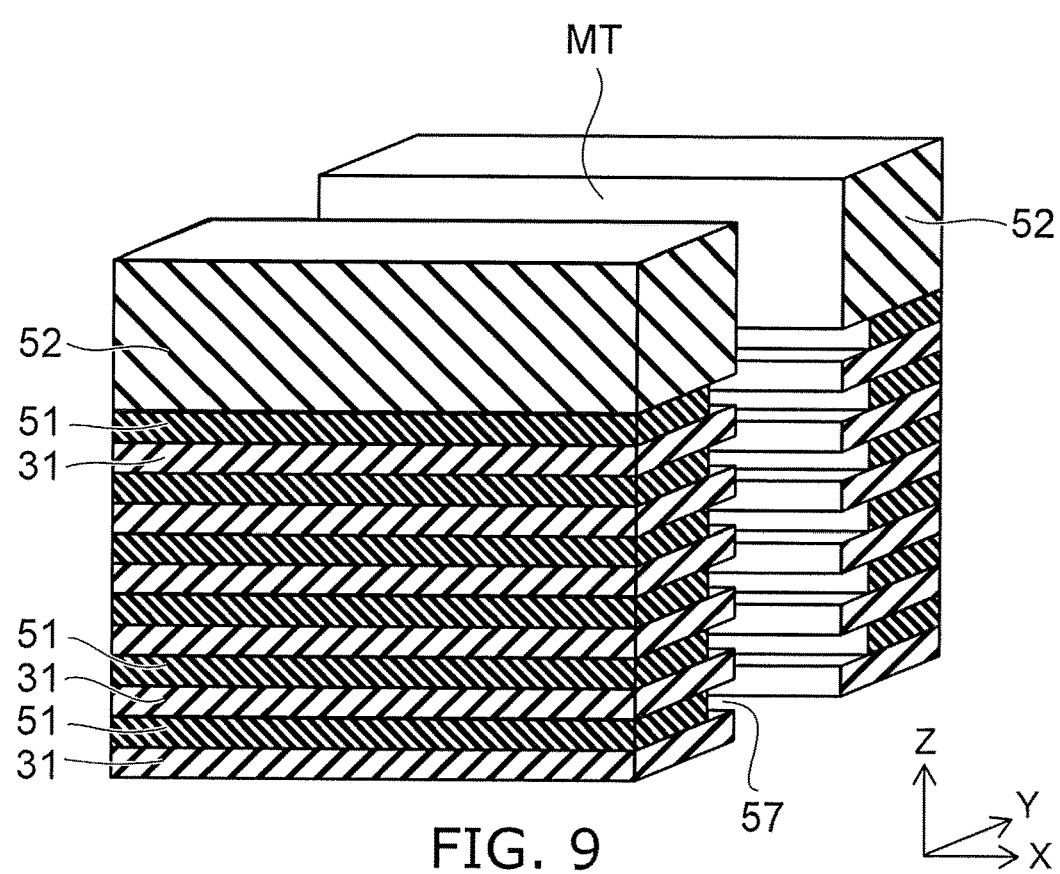

Then, as shown in FIG. 9, recesses 57 are formed in the side surface of the memory trench MT by recessing the sacrificial films 51 exposed at the side surface of the memory trench MT by performing, for example, wet etching using hot phosphoric acid via the memory trench MT. The recesses 57 are formed in loop configurations surrounding the memory trench MT. Also, the recesses 57 of multiple levels are arranged along the Z-direction. Then, a cover oxide film 59 (referring to FIG. 12) is formed by oxidizing the sacrificial films 51 exposed at the back surfaces of the recesses 57 by performing oxidation treatment.

Figure 10:
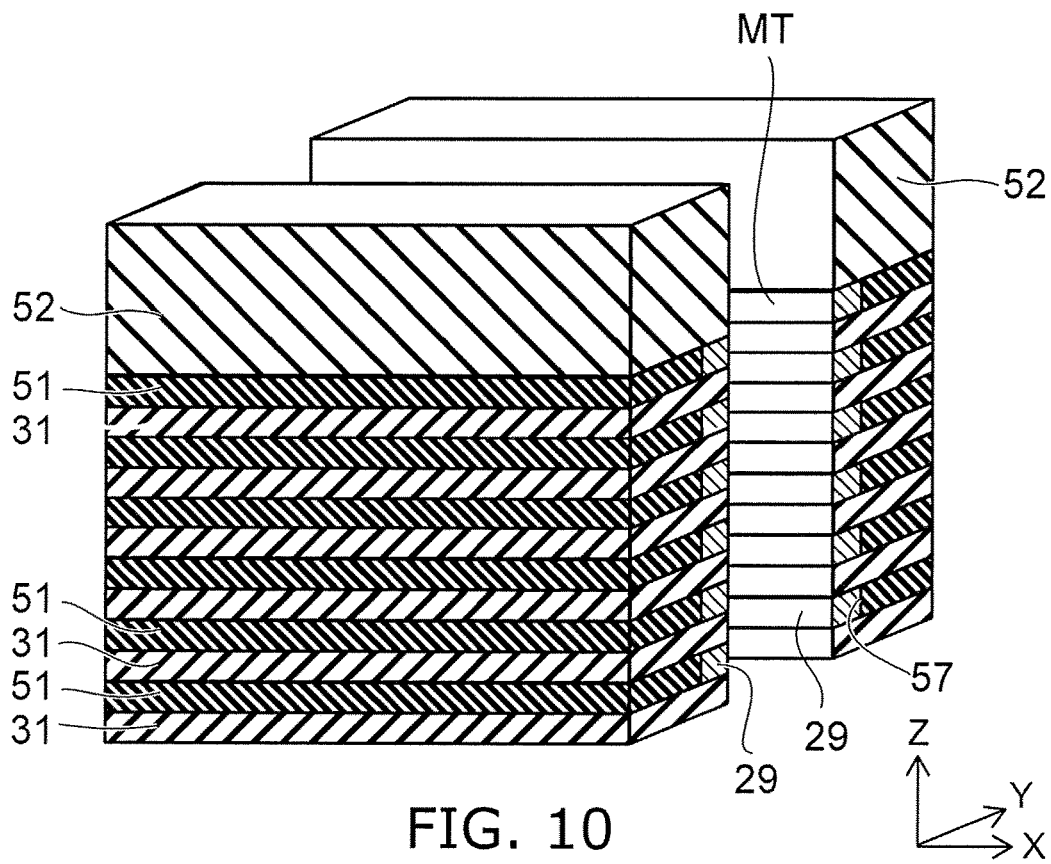

Then, as shown in FIG. 10, the high dielectric constant layer 37a is formed on the inner surface of the memory trench MT by depositing a high dielectric constant material including a metal. Then, a silicon film is formed on the high dielectric constant layer 37a by depositing silicon. Then, the portions of the silicon film and the high dielectric constant layer 37a deposited outside the recesses 57 are removed and the portions of the silicon film and the high dielectric constant layer 37a are caused to remain in the interiors of the recesses 57 by recessing the silicon film and the high dielectric constant layer 37a by performing wet etching using TMY (a choline aqueous solution), isotropic etching such as CDE (chemical dry etching), etc. Thereby, the high dielectric constant layer 37a is formed on the inner surfaces of the recesses 57; and the floating gate electrode films 29 that are made of silicon are formed inside the recesses 57.

Figure 11:
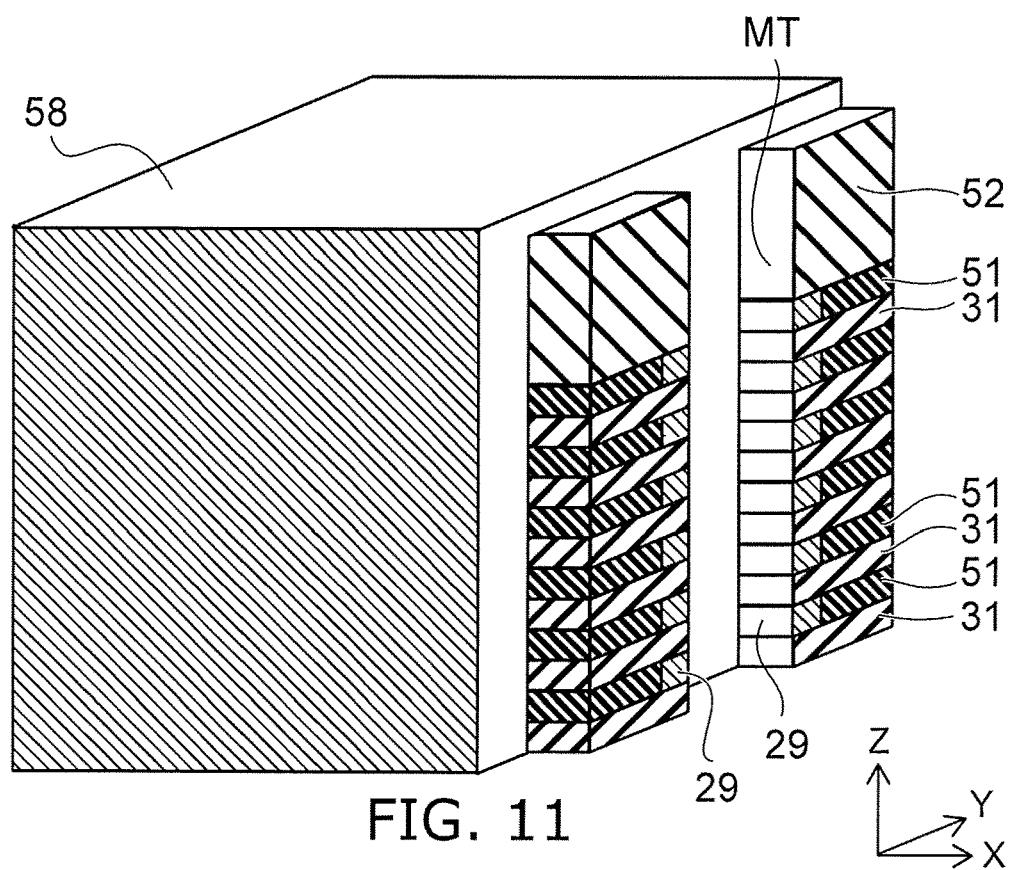

Then, as shown in FIG. 11, the tunneling insulating film 36 (referring to FIG. 5B) is formed by depositing silicon oxide on the inner surface of the memory trench MT using, for example, ALD (Atomic Layer Deposition: atomic layer deposition). Then, a cover silicon film is formed on the inner surface of the memory trench MT. Then, the silicon substrate 10 (referring to FIG. 3) is exposed by using RIE to remove the cover silicon film and the tunneling insulating film 36 deposited on the bottom surface of the memory trench MT. Then, a body silicon film is filled into the memory trench MT by depositing silicon. The body silicon film contacts the silicon substrate 10. Then, heat treatment for crystallizing the silicon is performed. A silicon member 58 is formed of the crystallized cover silicon film and body silicon film. The silicon member 58 covers the stacked body 20 and the hard mask film 52 and fills the interior of the memory trench MT.

FIG. 12 is a partial cross-sectional view showing the structure at this stage.

As shown in FIG. 12, the memory trench MT is formed in the stacked body 20 in which the inter-layer insulating films 31 made of silicon oxide and the sacrificial films 51 made of silicon nitride are stacked alternately; and the recesses 57 where the sacrificial films 51 recede are formed in the inner side surface of the memory trench MT. The cover oxide film 59 is formed on the back surfaces of the recesses 57; and the high dielectric constant layer 37a is formed on the inner surfaces of the recesses 57. The floating gate electrode films 29 that are made of polysilicon are filled into the interiors of the recesses 57. Also, the tunneling insulating film 36 is formed on the side surface of the memory trench MT to cover the inter-layer insulating films 31 and the floating gate electrode films 29. Then, the silicon member 58 is filled into the memory trench MT.

Figure 13:
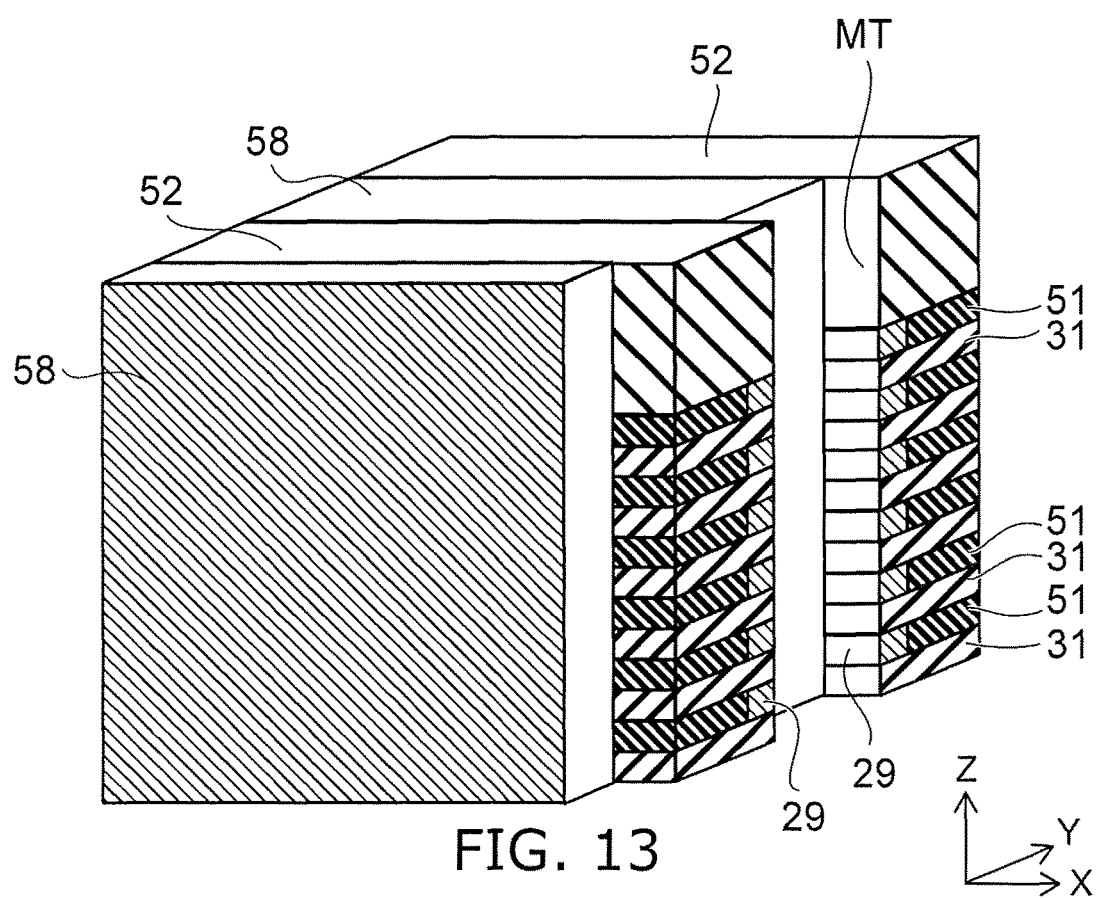
FIG. 13 to FIG. 15 are perspective views showing the method for manufacturing the semiconductor memory device according to the first embodiment.

Then, as shown in FIG. 13, the hard mask film 52 is exposed by performing etch-back of the upper surface of the silicon member 58. Thereby, the silicon member 58 remains only inside the memory trench MT.

Figure 14:
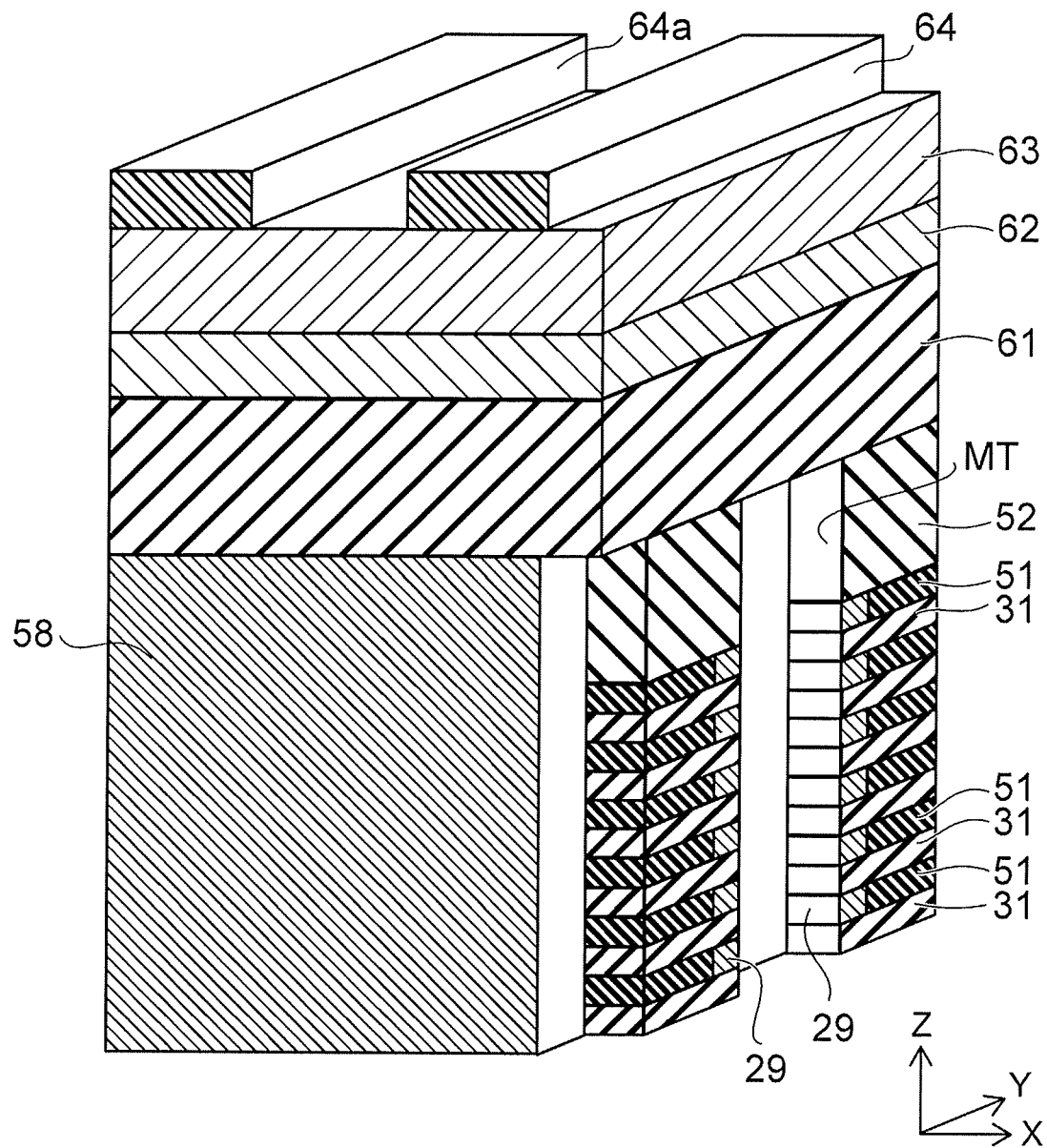

Then, as shown in FIG. 14, a hard mask film 61 that is made of silicon oxide is formed on the entire surface by CVD using TEOS as the source material. Then, a carbon film 62 and an anti-reflection film 63 are formed. Then, a resist pattern 64 is formed by forming a resist film and by patterning using lithography. Openings 64a having a line-and-space configuration extending in the Y-direction are formed in the resist pattern 64. When viewed from the Z-direction, the openings 64a are formed in a region directly above the entire portion MTy of the memory trench MT extending in the Y-direction and in a region crossing the portion MTx of the memory trench MT extending in the X-direction.

Figure 15:
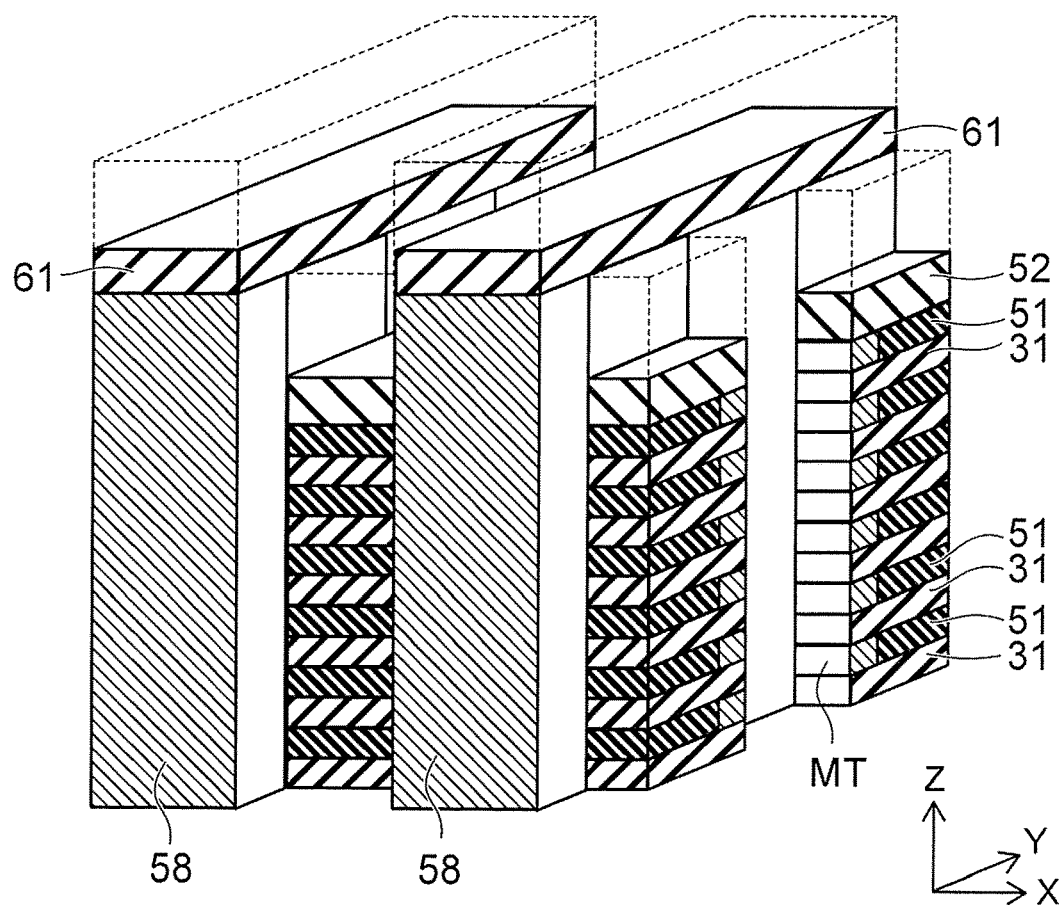

Then, as shown in FIG. 15, the pattern of the resist pattern 64 is transferred to the hard mask film 61 by performing RIE using the resist pattern 64 as a mask. Then, the silicon member 58 and the tunneling insulating film 36 that are filled into the memory trench MT are selectively removed and divided in the X-direction by performing RIE using the hard mask film 61 and the hard mask film 52 as a mask. This processing is called "AA patterning."

FIG. 16 is a plan view showing the configuration at this stage.

As shown in FIG. 16, as a result of the AA patterning, the silicon member 58 is divided into the multiple silicon pillars 26. The silicon pillars 26 are arranged in one column along the X-direction inside each of the portions MTx and are arranged in a matrix configuration along the X-direction and the Y-direction in the entire memory region Rm. Further, the tunneling insulating film 36 also is divided every silicon pillar 26. The floating gate electrode film 29 is exposed in the space where the silicon member 58 is removed.

Figure 17:
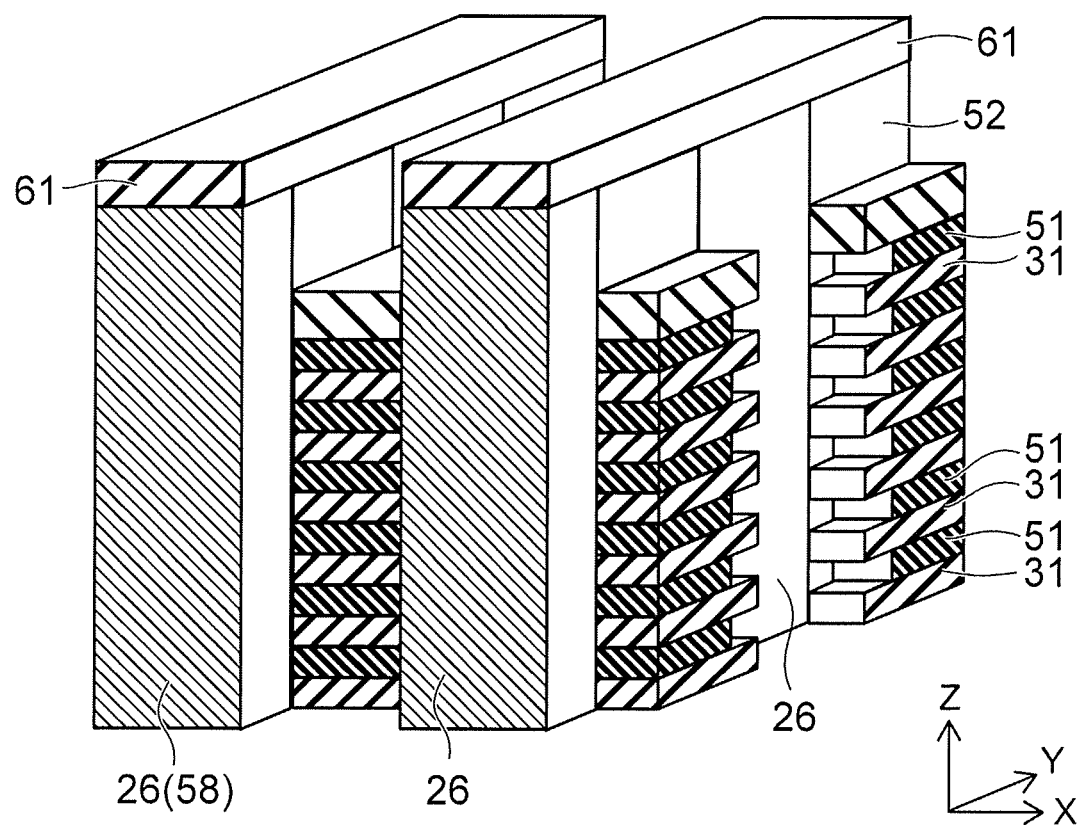
FIG. 17 to FIG. 23 are perspective views showing the method for manufacturing the semiconductor memory device according to the first embodiment.

Then, as shown in FIG. 17, the floating gate electrode 29 and the high dielectric constant layer 37a (referring to FIG. 16) that are filled into the recesses 57 are selectively removed by performing wet etching or isotropic etching such as CDE, etc., via the memory trench MT. Thereby, the floating gate electrode film 29 and the high dielectric constant layer 37a are divided every silicon pillar 26.

Figure 18:
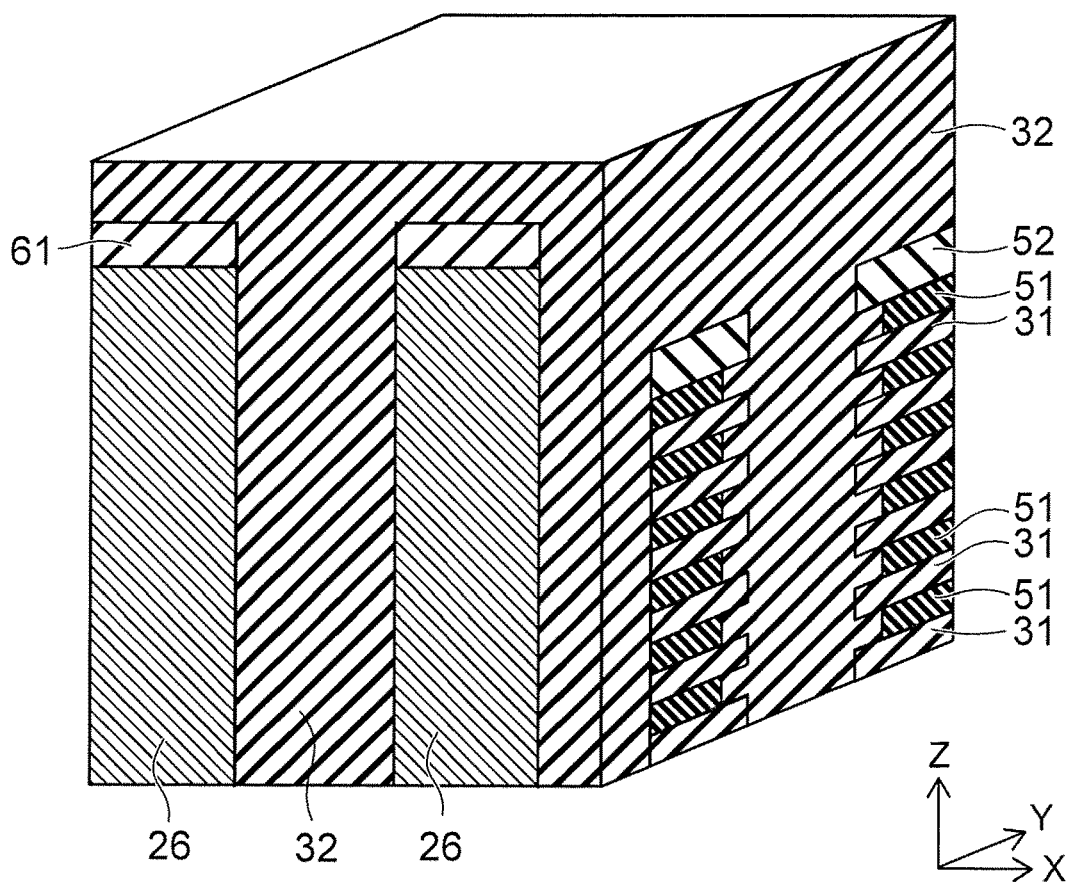

Then, as shown in FIG. 18, silicon oxide is deposited on the entire surface using CVD, coating, etc. Thereby, the insulating member 32 is formed to fill the gap between the silicon pillars 26.

Figure 19:
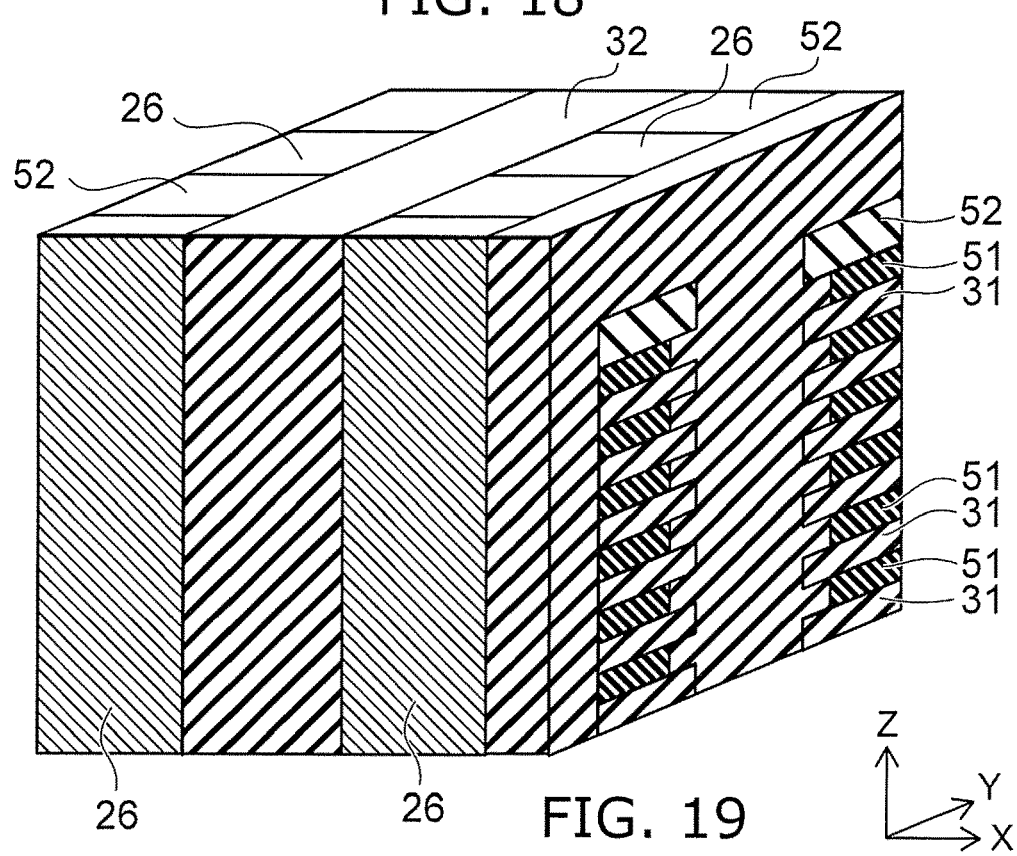

Then, as shown in FIG. 19, the upper surfaces of the silicon pillars 26 and the upper surface of the hard mask film 52 are exposed by performing etch-back using the silicon pillars 26 as a stopper.

Figure 20:
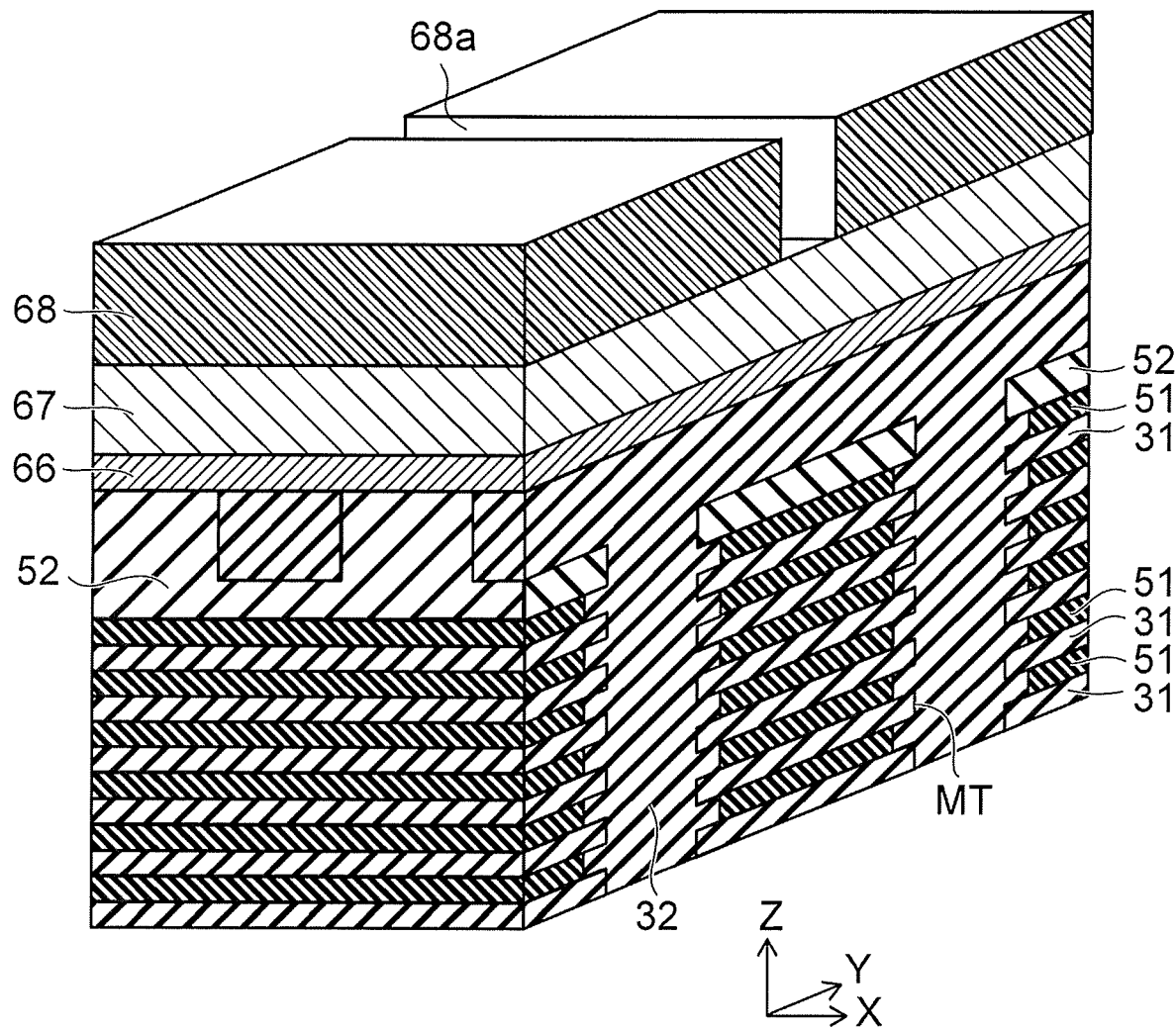

Then, as shown in FIG. 20, a carbon film 66, an anti-reflection film 67, and a resist pattern 68 are formed on the stacked body 20 and the hard mask film 52. An opening 68a that has a rectangular configuration having the X-direction as the longitudinal direction is multiply formed in the resist pattern 68 by lithography. Each of the openings 68a is disposed so that an end portion in the longitudinal direction of the opening 68a contacts the portion MTy of the memory trench MT extending in the Y-direction.

Figure 21:
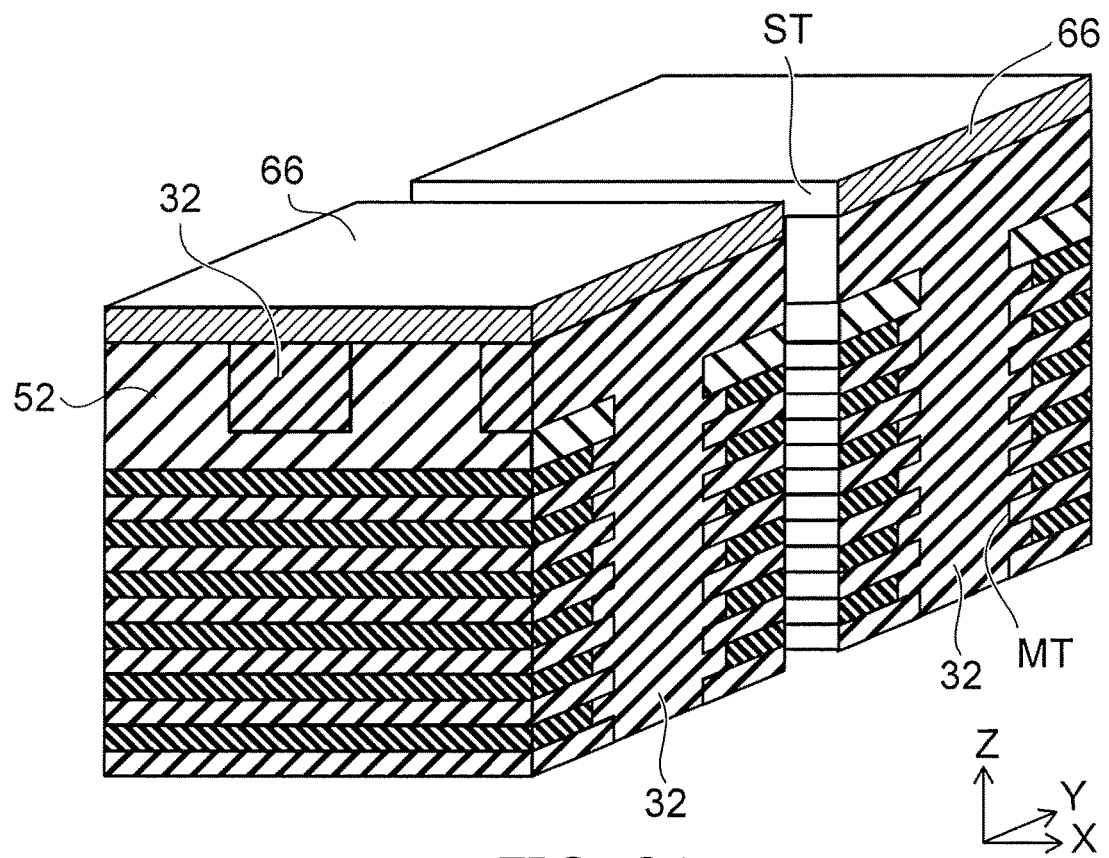

Then, as shown in FIG. 21, the slits ST that pierce the stacked body 20 are multiply formed by performing RIE using the resist pattern 68 as a mask. The insulating member 32 that is made of silicon oxide is exposed at the end surface of each of the slits ST communicating with the memory trench MT. The inter-layer insulating films 31 that are made of silicon oxide and the sacrificial films 51 that are made of silicon nitride are exposed at the other side surfaces.

Figure 22:
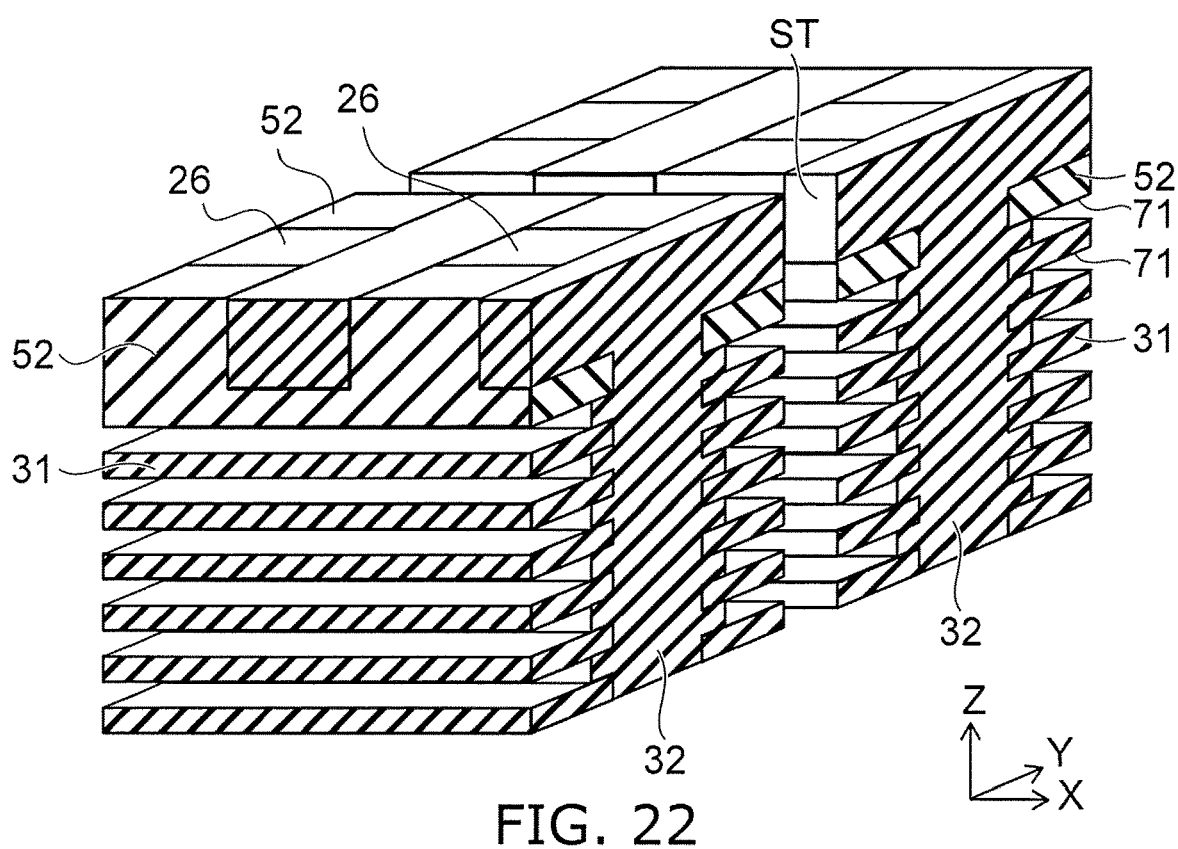

Then, as shown in FIG. 22, the sacrificial films 51 are removed via the slit ST by performing, for example, wet etching using hot phosphoric acid using the cover oxide film 59 (referring to FIG. 12) as an etching stopper. At this time, the insulating member 32 and the inter-layer insulating films 31 that are made of silicon oxide are substantially not etched. Thereby, recesses 71 are formed in the space where the sacrificial films 51 are removed. The cover oxide film 59 is exposed at the back surfaces of the recesses 71. Then, the cover oxide film 59 is removed.

Figure 23:
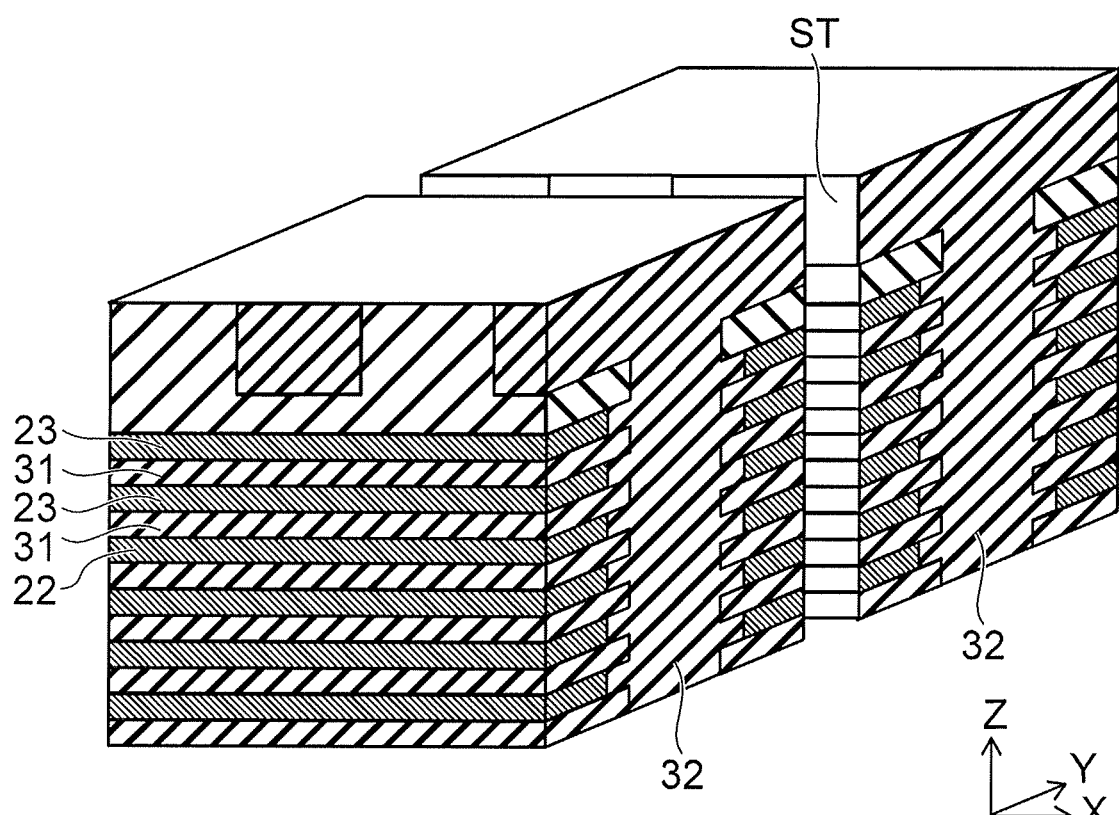

Then, as shown in FIG. 23, FIG. 5A, and FIG. 5B, the silicon oxide layer 37b is formed in the slit ST and on the inner surfaces of the recesses 71 by, for example, depositing silicon oxide using ALD. Then, the high dielectric constant layer 37c is formed on the silicon oxide layer 37b by depositing a high dielectric constant material such as silicon nitride (SiN), hafnium oxide (HfO$_2$), aluminum oxide (Al$_2$O$_3$), etc. Then, a barrier metal layer is formed on the high dielectric constant layer 37c by, for example, depositing titanium nitride using CVD. Then, a tungsten film is formed by, for example, depositing tungsten (W) using CVD. The tungsten film is formed to fill the entire interiors of the recesses 71. Then, the portions of the tungsten film and the barrier metal layer deposited outside the recesses 71 are removed by, for example, RIE and caused to remain inside the recesses 71.

Thereby, as shown in FIG. 23 and FIG. 1 to FIG. 3, the interconnect layers are formed of the barrier metal layer and the tungsten film disposed inside the recesses 71. In other words, the upper selection gate interconnect layers 23 are formed inside the recess 71 of the uppermost level and the recess 71 of the second level from the top; the comb-shaped member 21c of the lower selection gate interconnect layer 21 is formed inside the recess 71 of the lowermost level; and the comb-shaped members 22c of the word line interconnect layers 22 are formed inside the other recesses 71.

Then, as shown in FIG. 1 to FIG. 3, the insulating member 33 is filled into the slit ST by depositing silicon oxide and by performing CMP (chemical mechanical polishing) using the silicon pillars 26 as a stopper. Then, the upper selection gate interconnect layers 23 are divided along the Y-direction and cut into the multiple C-shaped conductive members 23c. Then, the link member 23b of the upper selection gate interconnect layer 23, the link member 22b of the word line interconnect layer 22, and a link member 21b of the lower selection gate interconnect layer 21 are exposed by patterning the two X-direction end portions of the stacked body 20 into the staircase configuration. Then, the inter-layer insulating film 30 that buries the entire stacked body 20 is formed by, for example, depositing silicon oxide; and the contacts 41 and 45, the intermediate interconnects 42 and 46, the vias 43, the bit line plugs 27, the upper layer interconnects 44 and 47, and the bit lines 28 are formed. Thus, the semiconductor memory device 1 according to the embodiment is manufactured.

Effects of the embodiment will now be described.

In the semiconductor memory device 1 according to the embodiment, in the program operation of one memory cell of two memory cells sharing one silicon pillar 26, misprogramming to the other memory cell of the two memory cells can be suppressed because the two word lines 22a having the silicon pillars 26 interposed can be driven independently from each other.

For example, for the first and second word lines 22a that have the same position in the Z-direction and have one silicon pillar 26 interposed, electrons can be injected into the first floating gate electrode film 29 disposed between the first word line 22a and the silicon pillar 26 by applying, to the first word line, a programming voltage that is positive with respect to the silicon pillar 26; and data can be programmed to the first memory cell. In such a case, by applying a voltage that is lower than the programming voltage to the second word line 22a or by setting the second word line 22a to a floating state, and by further setting the upper selection gate of the second word line side to be OFF, the injection of the electrons into the second floating gate electrode film 29 can be suppressed; and misprogramming of the second memory cell can be suppressed. Thus, according to the embodiment, a semiconductor memory device can be realized in which the reliability of the operation is high.

Conversely, if the same programming voltage is applied to the first and second word lines 22a, the operation of the first memory cell and the operation of the second memory cell are discriminated only by the voltage applied to the upper selection gate lines 23a. That is, the operation of the program/non-program for two NAND strings sharing the same silicon pillar 26 is controlled only by setting the upper selection gate of the NAND string to be programmed to be ON, by setting the upper selection gate of the other NAND string of the two NAND strings to be OFF, and by setting the other NAND strings to the boost state. Therefore, there are cases where the electrons that are introduced to the silicon pillar 26 are injected into the second floating gate electrode film 29. As a result, there is a risk that misprogramming of the second memory cell may undesirably occur in the program operation of the first memory cell.

Second Embodiment

A second embodiment will now be described.

Figure 24:
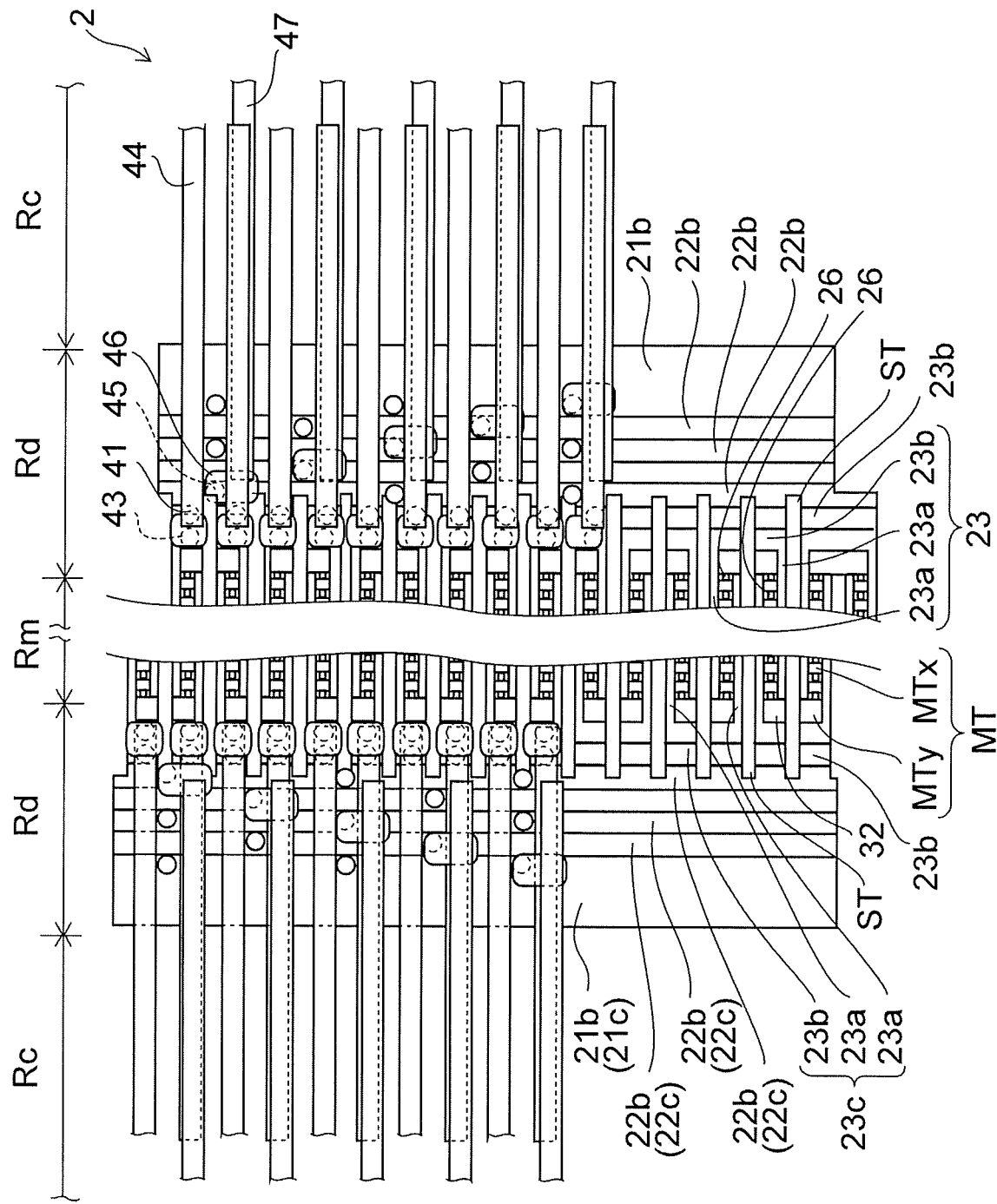
FIG. 24 is a plan view showing a semiconductor memory device according to a second embodiment.

FIG. 24 is a plan view showing a semiconductor memory device according to the embodiment.

Figure 25:
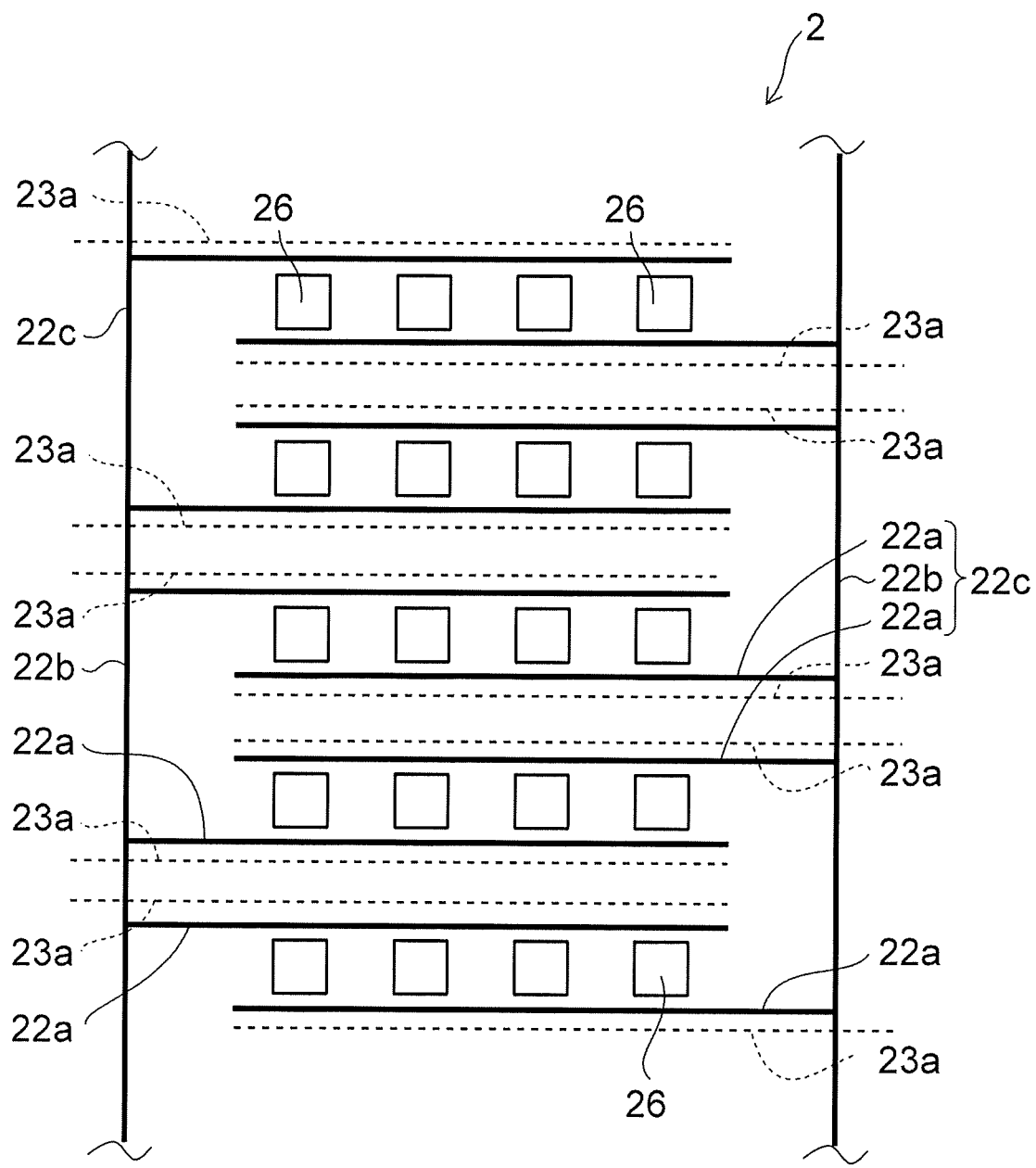
FIG. 25 is a schematic circuit diagram showing the semiconductor memory device according to the second embodiment.

FIG. 25 is a schematic circuit diagram showing the semiconductor memory device according to the embodiment.

As shown in FIG. 24, the semiconductor memory device 2 according to the embodiment differs from the semiconductor memory device 1 according to the first embodiment described above (referring to FIG. 2) in that the slit ST divides the portion MTy of the memory trench MT extending in the Y-direction and divides the upper selection gate interconnect layer 23 every upper selection gate line 23a. In other words, the link member 23b is not provided in the upper selection gate interconnect layer 23. The slit ST does not divide the link member 22b of the word line interconnect layer 22 and the link member 21b of the lower selection gate interconnect layer 21.

Thereby, as shown in FIG. 25, the upper selection gate lines 23a are separated from each other. Therefore, in the semiconductor memory device 2, the upper selection gate lines 23a can be driven independently one at a time.

Otherwise, the configuration, the manufacturing method, the operations, and the effects of the embodiment are similar to those of the first embodiment described above.

Third Embodiment

A third embodiment will now be described.

Figure 26:
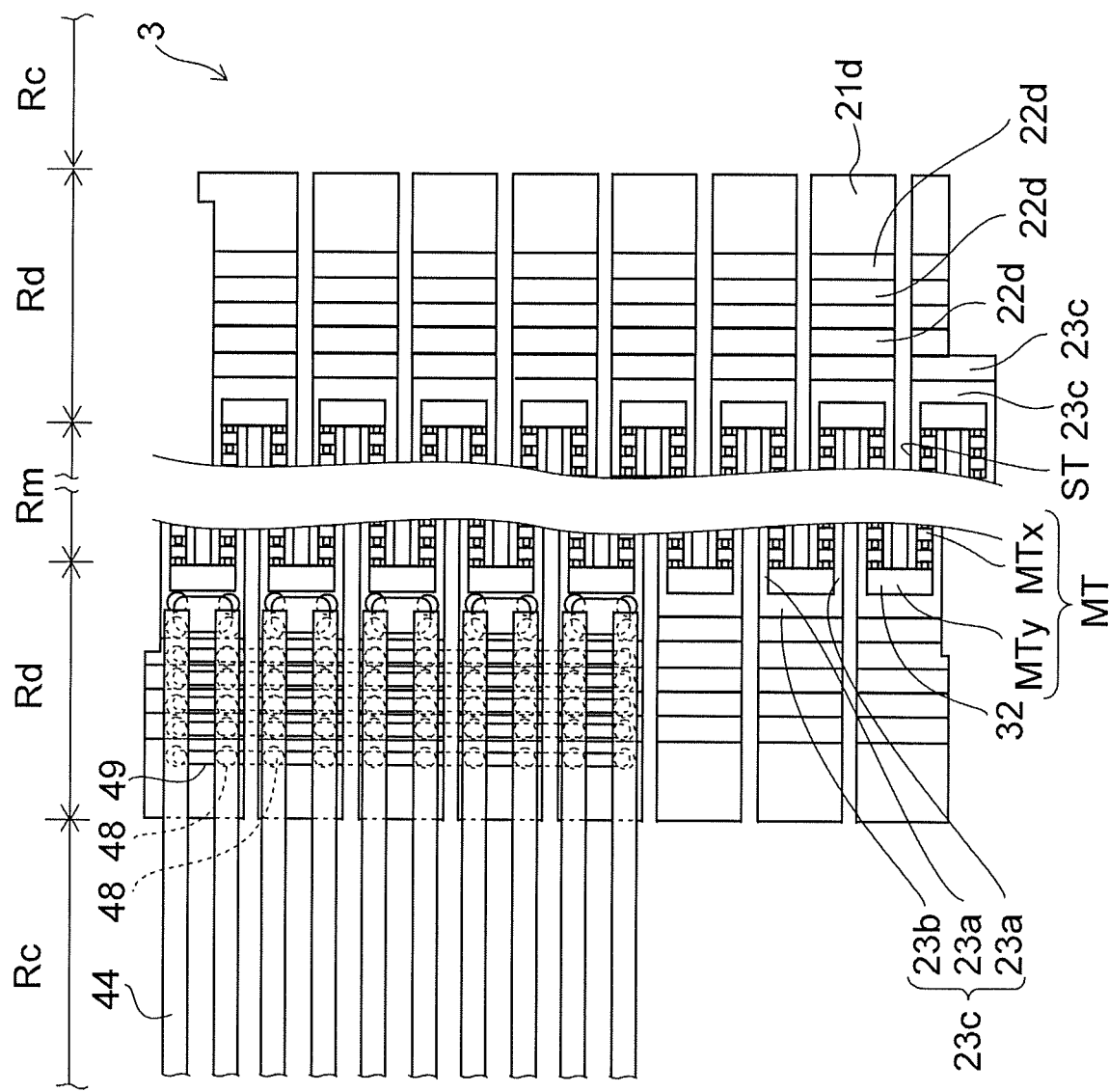
FIG. 26 is a plan view showing a semiconductor memory device according to a third embodiment.

FIG. 26 is a plan view showing a semiconductor memory device according to the embodiment.

Figure 27:
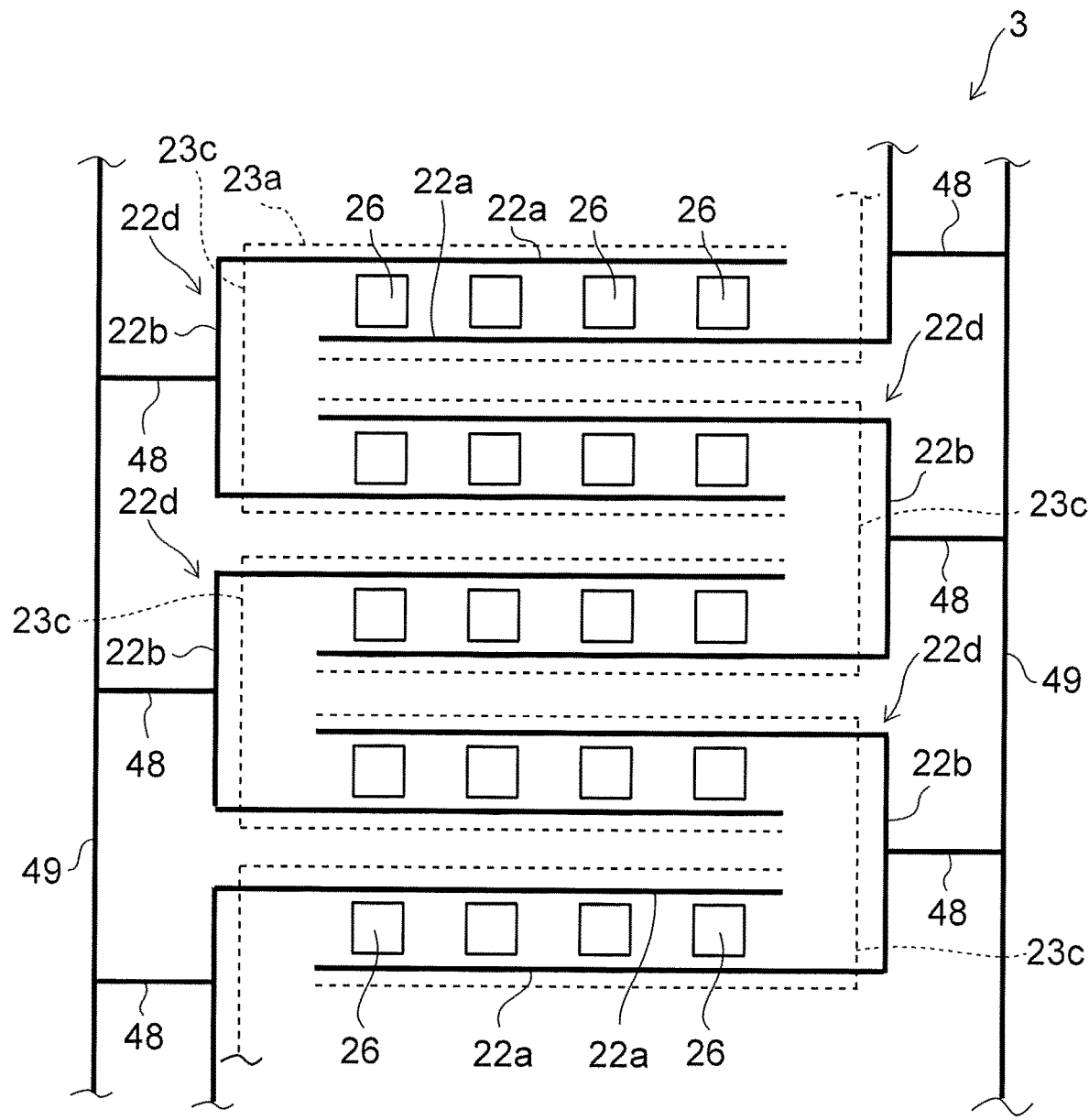
FIG. 27 is a schematic circuit diagram showing the semiconductor memory device according to the third embodiment.

FIG. 27 is a schematic circuit diagram showing the semiconductor memory device according to the embodiment.

As shown in FIG. 26, the semiconductor memory device 3 according to the embodiment differs from the semiconductor memory device 1 according to the first embodiment described above (referring to FIG. 2) in that the slit ST is long. Similarly to the first embodiment, an end in the longitudinal direction of the slit ST contacts the portion MTy of the memory trench MT. On the other hand, unlike the first embodiment, the slit ST extends to the outer edge of the stacked body 20 and divides the upper selection gate interconnect layer 23, the word line interconnect layer 22, and the lower selection gate interconnect layer 21.

Therefore, similarly to the upper selection gate interconnect layer 23, the word line interconnect layer 22 is subdivided into multiple C-shaped conductive members 22d instead of a pair of comb-shaped members. Two word lines 22a are provided for each of the conductive members 22d. A via 48 is provided on the conductive member 22d; and an upper layer interconnect 49 that extends in the Y-direction is provided on the via 48. Then, the multiple conductive members 22d are connected commonly to the upper layer interconnect 49 by the vias 48. This is similar for the lower selection gate interconnect layer 21 as well.

Accordingly, as shown in FIG. 27, the electrical connectional relationship of the word line interconnect layer 22 is similar to that of the first embodiment (referring to FIG. 4). However, in the embodiment, the two word lines 22a of each of the conductive members 22d are bundled by the link member 22b; and the conductive members 22d are connected to each other by the upper layer interconnect 49.

For example, the connectional relationship between the word lines 22a of the embodiment can be expressed as follows. This is similar for the lower selection gate line 21a as well.

Namely, where n is an integer of 0 or more, the (8n+1)th word line 22a and the (8n+4)th word line 22a are connected as one body by the first link member 22b; the (8n+3)th word line 22a and the (8n+6)th word line 22a are connected as one body by the second link member 22b; the (8n+5)th word line 22a and the (8n+8)th word line 22a are connected as one body by the third link member 22b; and the (8n+7)th word line 22a and the (8n+10)th word line 22a are connected as one body by the fourth link member 22b. Also, the first link member 22b and the third link member 22b are connected to the first upper layer interconnect 49 by the vias 48; and the second link member 22b and the fourth link member 22b are connected to the second upper layer interconnect 49 by the vias 48.

According to the embodiment, the lithography for forming the slits ST (referring to FIG. 20) is easy because the slits ST can be formed in a configuration that is nearly line-and-space.

Otherwise, the configuration, the manufacturing method, the operations, and the effects of the embodiment are similar to those of the first embodiment described above.

Fourth Embodiment

A fourth embodiment will now be described.

Figure 28:
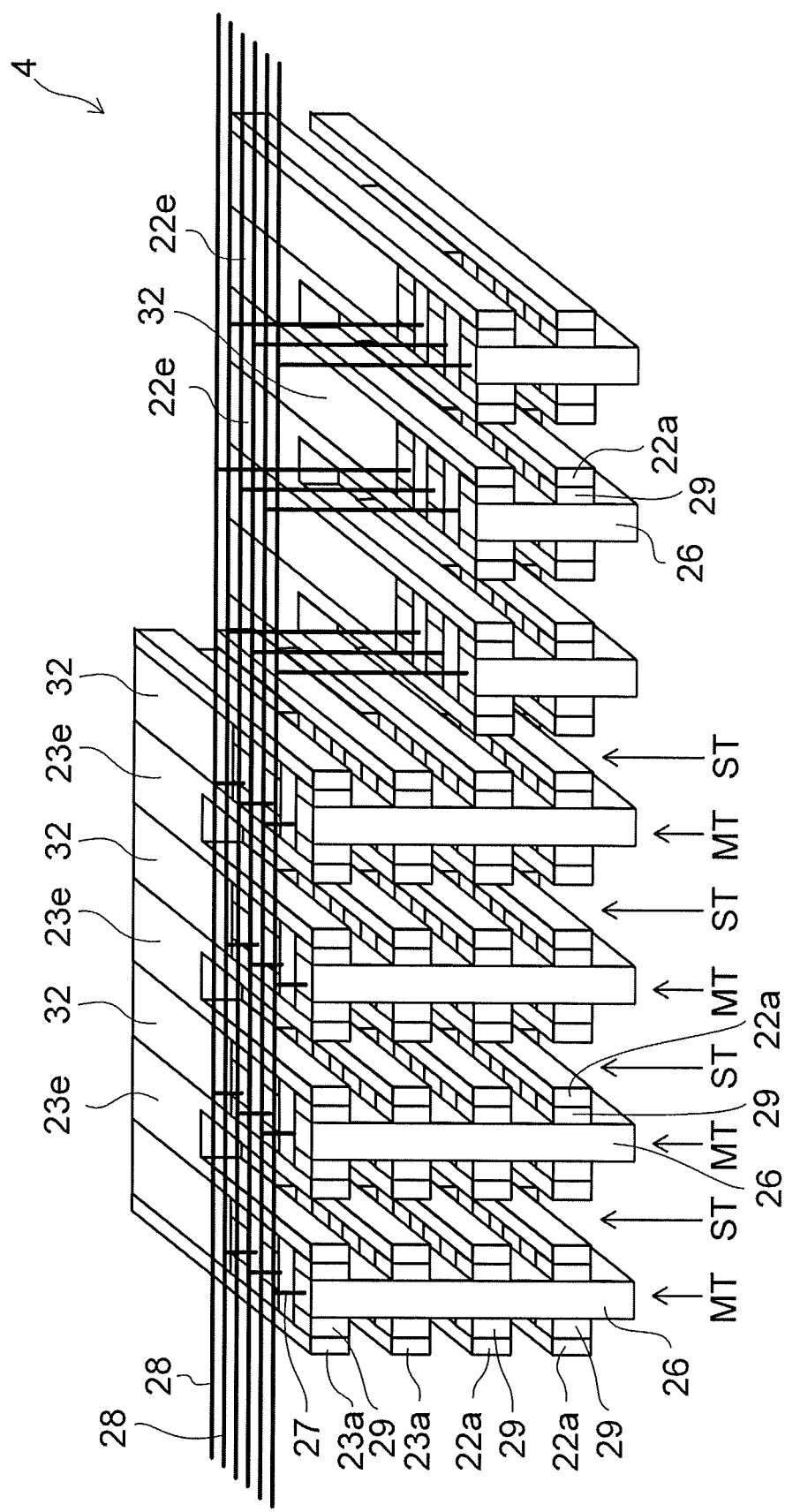
FIG. 28 is a perspective view showing a semiconductor memory device according to a fourth embodiment.

FIG. 28 is a perspective view showing a semiconductor memory device according to the embodiment.

Figure 29:
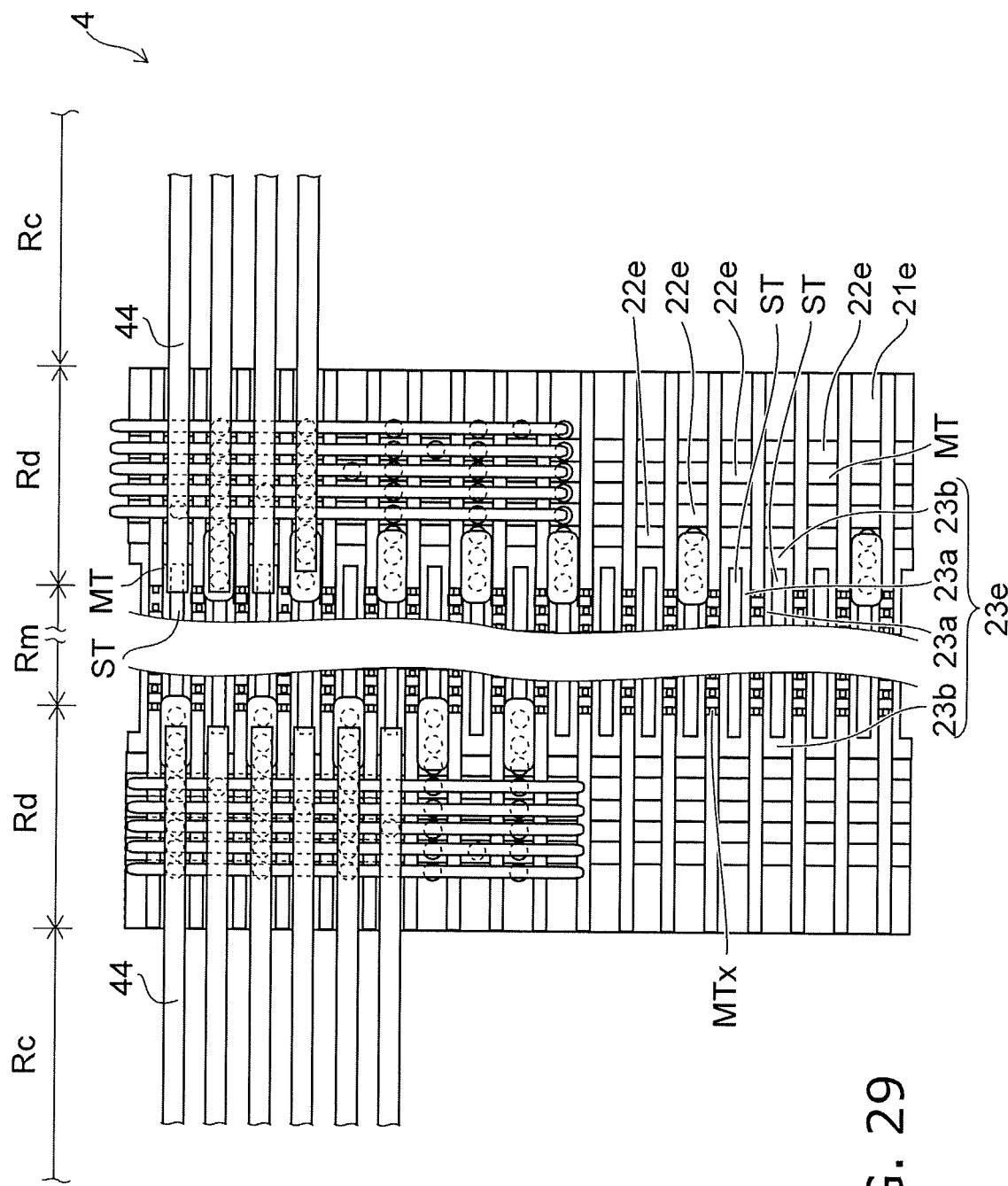
FIG. 29 is a plan view showing the semiconductor memory device according to the fourth embodiment.

FIG. 29 is a plan view showing the semiconductor memory device according to the embodiment.

Figure 30:
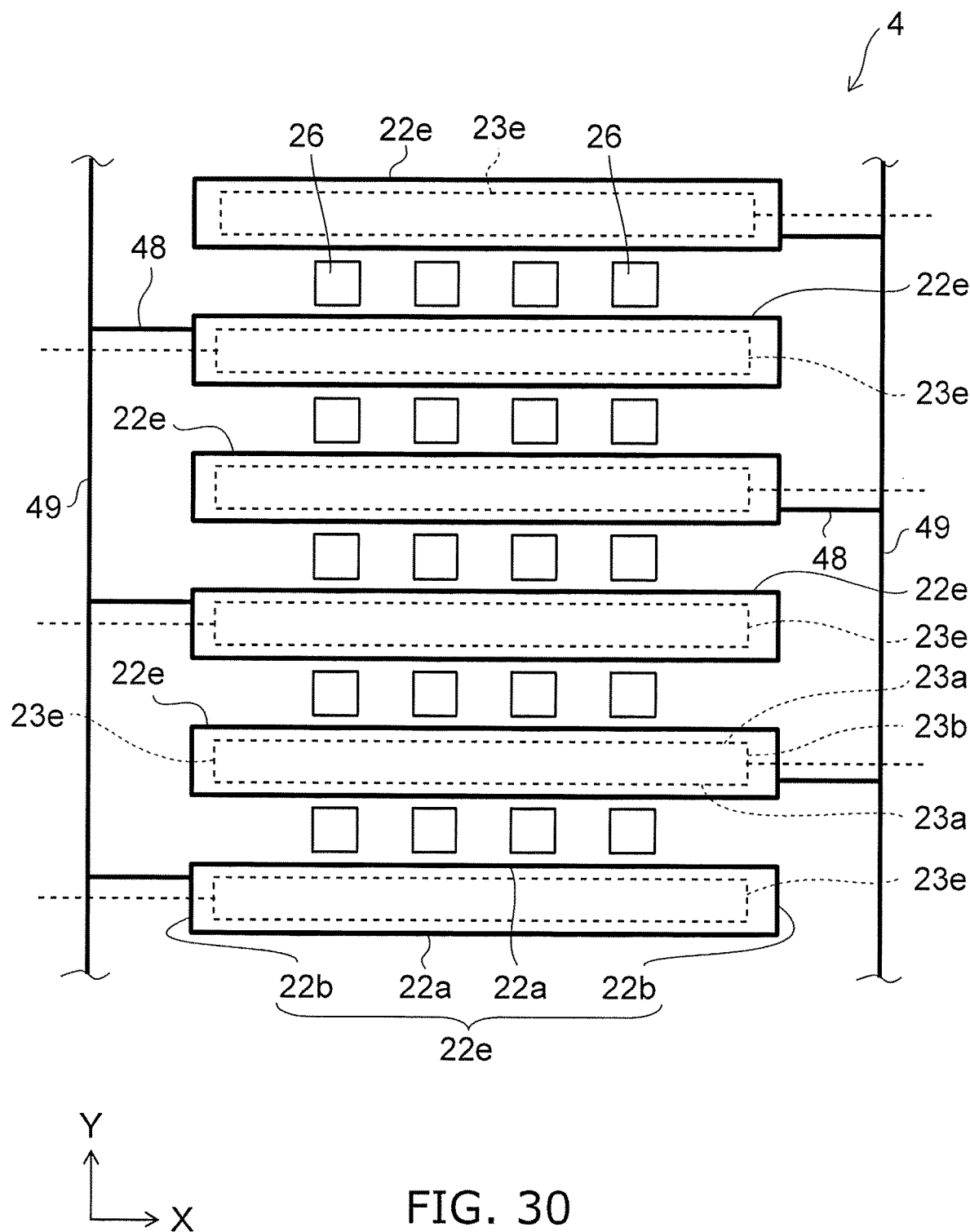
FIG. 30 is a schematic circuit diagram showing the semiconductor memory device according to the fourth embodiment.

FIG. 30 is a schematic circuit diagram showing the semiconductor memory device according to the embodiment.

In the semiconductor memory device 4 according to the embodiment as shown in FIG. 28 and FIG. 29, the memory trench MT is formed in a line-and-space configuration extending in the X-direction instead of the snake-like configuration. Also, compared to the semiconductor memory device 1 according to the first embodiment (referring to FIG. 2), the slit ST is short; and the two X-direction end portions of the slit ST do not divide the upper selection gate interconnect layers 23, the word line interconnect layers 22, and the lower selection gate interconnect layer 21.

As a result, as shown in FIG. 29 and FIG. 30, the upper selection gate interconnect layer 23, the word line interconnect layer 22, and the lower selection gate interconnect layer 21 respectively are divided into loop-shaped members 23e, 22e, and 21e surrounding the slit ST. In the loop-shaped member 23e, the two end portions of the two upper selection gate lines 23a extending in the X-direction are connected by the two link members 23b. Similarly, in the loop-shaped member 22e, the two end portions of the two word lines 22a extending in the X-direction are connected by the two link members 22b; and in the loop-shaped member 21e, the two end portions of the two lower selection gate lines 21a extending in the X-direction are connected by the two link members 21b. Also, the silicon pillars 26 are disposed between the two mutually-adjacent loop-shaped members 23e.

Also, the loop-shaped members 23e are not connected to each other and can be driven independently. On the other hand, every other loop-shaped member 22e is connected to a common upper layer interconnect 49. In other words, the loop-shaped member 22e that is connected to a first upper layer interconnect 49 and the loop-shaped member 22e that is connected to a second upper layer interconnect 49 are arranged alternately along the Y-direction. The loop-shaped member 21e also is similar to the loop-shaped member 22e. Thereby, the two word lines 22a that have one silicon pillar 26 interposed can be driven independently from each other.

For example, the connectional relationship between the word lines 22a of the embodiment can be expressed as follows. This is similar for the lower selection gate line 21a as well.

Namely, where n is an integer of 0 or more, the (8n+2)th word line 22a and the (8n+3)th word line 22a are a portion of the first loop-shaped member 22e; the (8n+4)th word line 22a and the (8n+5)th word line 22a are a portion of the second loop-shaped member 22e; the (8n+6)th word line 22a and the (8n+7)th word line 22a are a portion of the third loop-shaped member 22e; and the (8n+8)th word line 22a and the (8n+9)th word line 22a are a portion of the fourth loop-shaped member 22e. Also, the first loop-shaped member 22e is connected to the third loop-shaped member 22e via the second upper layer interconnect 49; and the second loop-shaped member 22e is connected to the fourth loop-shaped member 22e via the second upper layer interconnect 49.

According to the embodiment, the lithography for forming the memory trench MT (referring to FIG. 7) is easy because the memory trench MT can be formed in a line-and-space configuration instead of the snake-like configuration.

Otherwise, the configuration, the manufacturing method, the operations, and the effects of the embodiment are similar to those of the first embodiment described above.

According to the embodiments described above, a semiconductor memory device can be realized in which the reliability of the operation is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor memory device, comprising:
a substrate;
a first semiconductor pillar extending in a first direction away from the substrate;
a second semiconductor pillar extending in the first direction, the first semiconductor pillar and the second semiconductor pillar being arranged along a second direction parallel to a surface of the substrate;
a first memory cell provided on a side surface of the first semiconductor pillar, the first memory cell being controllable by a first control gate extending in a third direction parallel to the surface of the substrate;
a second memory cell provided on another side surface of the first semiconductor pillar, the second memory cell facing the first memory cell via the first semiconductor pillar in a fourth direction parallel to the surface of the substrate, perpendicular to the third direction, the second memory cell being controllable by a second control gate extending in the third direction;
a third memory cell provided on a side surface of the second semiconductor pillar, the third memory cell being controllable by applying a voltage to a first signal line electrically connected to the second control gate;
a fourth memory cell provided on another side surface of the second semiconductor pillar, the fourth memory cell facing the third memory cell via the second semiconductor pillar in the fourth direction, the fourth memory cell being controllable by a third control gate extending in the third direction;
a first contact connected to a first end portion of the first semiconductor pillar, the first end portion being located away from the surface of the substrate;
a second contact connected to a second end portion of the second semiconductor pillar, the second end portion being located away from the surface of the substrate;
a first bit line connected to the first contact, the first bit line extending in the fourth direction;
a second bit line connected to the second contact, the second bit line extending in the fourth direction, the first bit line and the second bit line lying next to each other in the third direction;
a third semiconductor pillar extending in the first direction, the third semiconductor pillar being adjacent to the first semiconductor pillar in the fourth direction; and
a third contact connected to a third end portion of the third semiconductor pillar, the third end portion being located away from the surface of the substrate,
wherein
the first contact and the third contact are electrically connected to the first bit line, and
the second semiconductor pillar is provided between the first semiconductor pillar and the third semiconductor pillar in the fourth direction and is provided at a different location from the first semiconductor pillar and the third semiconductor pillar in the third direction.

2. The semiconductor memory device according to claim 1, further comprising:
a fifth memory cell provided on a side surface of the third semiconductor pillar, the fifth memory cell being controllable by applying another voltage to a second signal line electrically connected to the third control gate; and
a sixth memory cell provided on another side surface of the third semiconductor pillar, the sixth memory cell facing the fifth memory cell via the third semiconductor pillar in the fourth direction, the sixth memory cell being controllable by a fourth control gate extending in the third direction.

3. The semiconductor memory device according to claim 2, wherein
the third control gate and the first control gate are shared electrically by the second signal line.

4. The semiconductor memory device according to claim 2, wherein
the second control gate and the fourth control gate are shared electrically by the first signal line.

5. The semiconductor memory device according to claim 1, further comprising:
- a fourth semiconductor pillar extending in the first direction, the fourth semiconductor pillar being adjacent to the second semiconductor pillar in the fourth direction; and
- a fourth contact connected to a fourth end portion of the fourth semiconductor pillar, the fourth end portion being located away from the surface of the substrate,
- wherein the second contact and the fourth contact are connected to the second bit line.

6. A semiconductor memory device, comprising:
- a first semiconductor pillar extending in a first direction away from a substrate;
- a second semiconductor pillar extending in the first direction, the second semiconductor pillar being adjacent to the first semiconductor pillar in a second direction crossing the first direction;
- a third semiconductor pillar extending in the first direction, the third semiconductor pillar being provided between the first semiconductor pillar and the second semiconductor pillar in the second direction and provided at a different location from the first semiconductor pillar and the second semiconductor pillar in a third direction crossing the first direction and second direction;
- a first memory cell provided on a side surface of the first semiconductor pillar, the first memory cell being controllable by a first control gate extending in the third direction;
- a second memory cell provided on another side surface of the first semiconductor pillar, the second memory cell facing the first memory cell via the first semiconductor pillar in the second direction, the second memory cell being controllable by a second control gate extending in the third direction;
- a third memory cell provided on a side surface of the third semiconductor pillar, the third memory cell being controllable by applying a first voltage to a first signal line electrically connected to the second control gate;
- a fourth memory cell provided on another side surface of the third semiconductor pillar, the fourth memory cell facing the third memory cell via the third semiconductor pillar in the second direction, the fourth memory cell being controllable by a third control gate extending in the third direction;
- a fifth memory cell provided on a side surface of the second semiconductor pillar, the fifth memory cell being controllable by applying a second voltage to a second signal line electrically connected to the third control gate;
- a sixth memory cell provided on another side surface of the second semiconductor pillar, the sixth memory cell facing the fifth memory cell via the second semiconductor pillar in the second direction, the sixth memory cell being controllable by applying a third voltage to the first signal line electrically connected to the second control gate;
- a first contact connected to a first end portion of the first semiconductor pillar, the first end portion being located away from a surface of the substrate;
- a second contact connected to a second end portion of the second semiconductor pillar, the second end portion being located away from the surface of the substrate;
- a third contact connected to a third end portion of the third semiconductor pillar, the third end portion being located away from the surface of the substrate;
- a first bit line connected to the first contact and the second contact; and
- a second bit line connected to the third contact, the first bit line and the second bit line lying next to each other in the third direction.

7. The semiconductor memory device according to claim 6, further comprising:
- a fourth semiconductor pillar extending in the first direction,
- wherein the third semiconductor pillar is provided between the first semiconductor pillar and the fourth semiconductor pillar in the third direction and is provided at a different location from the first semiconductor pillar and the fourth semiconductor pillar in the second direction.

8. The semiconductor memory device according to claim 7, further comprising:
- an insulating layer being provided between the first semiconductor pillar and the fourth semiconductor pillar.

9. The semiconductor memory device according to claim 7, further comprising:
- a seventh memory cell provided on a side surface of the fourth semiconductor pillar, the seventh memory cell being controllable by the first control gate; and
- an eighth memory cell provided on another side surface of the fourth semiconductor pillar, the eighth memory cell facing the seventh memory cell via the fourth semiconductor pillar in the second direction, the eighth memory cell being controllable by the second control gate.

10. The semiconductor memory device according to claim 7, further comprising:
- a fourth contact connected to a fourth end portion of the fourth semiconductor pillar, the fourth end portion being located away from the surface of the substrate; and
- a third bit line connected to the fourth contact, the second bit line being provided between the first bit line and the third bit line in the third direction.

11. The semiconductor memory device according to claim 6, wherein
- the first control gate and the third control gate are shared electrically by the second signal line.

12. A semiconductor memory device, comprising:
- a substrate;
- a first semiconductor pillar extending in a first direction away from the substrate;
- a second semiconductor pillar extending in the first direction, the first semiconductor pillar and the second semiconductor pillar being arranged along a second direction parallel to a surface of the substrate;
- a first memory cell provided on a side surface of the first semiconductor pillar, the first memory cell being controllable by a first control gate extending in a third direction parallel to the surface of the substrate;
- a second memory cell provided on another side surface of the first semiconductor pillar, the second memory cell facing the first memory cell via the first semiconductor pillar in a fourth direction parallel to the surface of the substrate, perpendicular to the third direction, the second memory cell being controllable by a second control gate extending in the third direction;
- a third memory cell provided on a side surface of the second semiconductor pillar, the third memory cell being controllable by a third control gate extending in the third direction;

a fourth memory cell provided on another side surface of the second semiconductor pillar, the fourth memory cell facing the third memory cell via the second semiconductor pillar in the fourth direction, the fourth memory cell being controllable by a fourth control gate extending in the third direction;

an insulating layer being provided between the second control gate and the third control gate, the insulating layer extending in the first and third directions;

a first contact connected to a first end portion of the first semiconductor pillar, the first end portion being located away from the surface of the substrate;

a second contact connected to a second end portion of the second semiconductor pillar, the second end portion being located away from the surface of the substrate;

a first bit line connected to the first contact, the first bit line extending in the fourth direction;

a second bit line connected to the second contact, the second bit line extending in the fourth direction, the first bit line and the second bit line lying next to each other in the third direction;

a third semiconductor pillar extending in the first direction, the third semiconductor pillar being adjacent to the first semiconductor pillar in the fourth direction; and a third contact connected to a third end portion of the third semiconductor pillar, the third end portion being located away from the surface of the substrate, wherein the first contact and the third contact are electrically connected to the first bit line.

13. The semiconductor memory device according to claim 12, wherein the second control gate and the third control gate are provided between the first control gate and the fourth control gate.

14. The semiconductor memory device according to claim 12, wherein the first control gate and the fourth control gate are shared electrically by applying a voltage to a first signal line.

15. The semiconductor memory device according to claim 12, wherein the second control gate and the third control gate are shared electrically by applying a voltage to a second signal line.

16. The semiconductor memory device according to claim 12, wherein the second semiconductor pillar is provided between the first semiconductor pillar and the third semiconductor pillar in the fourth direction, and is provided at a different location from the first semiconductor pillar and the third semiconductor pillar in the third direction.

* * * * *